(12) United States Patent
Sakamoto et al.

(10) Patent No.: US 11,393,985 B2
(45) Date of Patent: Jul. 19, 2022

(54) ORGANIC ELECTROLUMINESCENCE DEVICE AND POLYCYCLIC COMPOUND FOR ORGANIC ELECTROLUMINESCENCE DEVICE

(71) Applicant: SAMSUNG DISPLAY CO., LTD., Yongin-si (KR)

(72) Inventors: Naoya Sakamoto, Yokohama (JP); Nobutaka Akashi, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 429 days.

(21) Appl. No.: 16/424,851

(22) Filed: May 29, 2019

(65) Prior Publication Data

US 2020/0020866 A1 Jan. 16, 2020

(30) Foreign Application Priority Data

Jul. 11, 2018 (KR) .................. 10-2018-0080435

(51) Int. Cl.
*C09K 11/06* (2006.01)
*C07F 5/02* (2006.01)
(Continued)

(52) U.S. Cl.
CPC ............ *H01L 51/0072* (2013.01); *C07F 5/02* (2013.01); *H01L 51/0067* (2013.01); *H01L 51/5012* (2013.01)

(58) Field of Classification Search
CPC ........ C07F 5/02; C09K 11/06; H01L 51/0072
See application file for complete search history.

(56) References Cited

U.S. PATENT DOCUMENTS

2013/0306945 A1* 11/2013 Seo ..................... H01L 51/5072
257/40
2016/0248015 A1 8/2016 Stoessel

FOREIGN PATENT DOCUMENTS

CN 106467553 A 3/2017
CN 106467554 A 3/2017
(Continued)

OTHER PUBLICATIONS

Computer-generated English-language translation of KR-20180112722-A.*

*Primary Examiner* — Vu A Nguyen
(74) *Attorney, Agent, or Firm* — Lewis Roca Rothgerber Christie LLP

(57) ABSTRACT

An organic electroluminescence device and a polycyclic compound, the device including a first electrode; a hole transport region on the first electrode; an emission layer on the hole transport region; an electron transport region on the emission layer; and a second electrode on the electron transport region, wherein the emission layer includes a polycyclic compound represented by the following Formula 1:

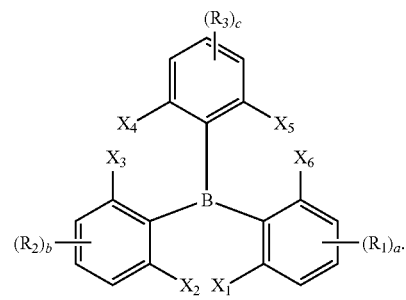

[Formula 1]

9 Claims, 2 Drawing Sheets

(51) Int. Cl.
*H01L 51/00* (2006.01)
*H01L 51/50* (2006.01)

(56) References Cited

FOREIGN PATENT DOCUMENTS

| | | | |
|---|---|---|---|
| JP | 2013-056859 A | | 3/2013 |
| JP | 2016-535723 A | | 11/2016 |
| KR | 10-2016-0065157 A | | 6/2016 |
| KR | 20180112722 A | * | 10/2018 |
| WO | WO 2015/049030 A2 | | 4/2015 |
| WO | WO 2017/092508 A1 | | 6/2017 |
| WO | WO 2017/176841 A1 | | 10/2017 |
| WO | WO-2017176841 A1 | * | 10/2017 ......... H01L 51/0071 |

\* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

Korean Patent Application No. 10-2018-0080435, filed on Jul. 11, 2018, in the Korean Intellectual Property Office, and entitled: "Organic Electroluminescence Device and Polycyclic Compound for Organic Electroluminescence Device," is incorporated by reference herein in its entirety.

BACKGROUND

1. Field

Embodiments relate to an organic electroluminescence device and a polycyclic compound used in the organic electroluminescence device.

2. Description of the Related Art

Recently, the development of an organic electroluminescence display device as an image display device has been considered. Different from a liquid crystal display device, the organic electroluminescence display device is a self-luminescent display device in which holes and electrons injected from a first electrode and a second electrode recombine in an emission layer, and a light emission material including an organic compound in the emission layer emits light to attain display.

SUMMARY

The embodiments may be realized by providing an organic electroluminescence device including a first electrode; a hole transport region on the first electrode; an emission layer on the hole transport region; an electron transport region on the emission layer; and a second electrode on the electron transport region, wherein the emission layer includes a polycyclic compound represented by the following Formula 1:

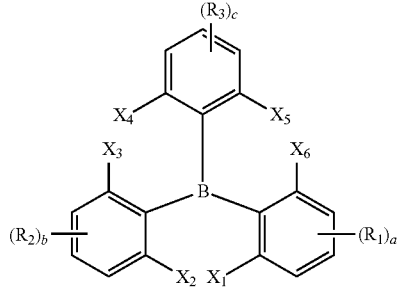

[Formula 1]

wherein, in Formula 1, $R_1$ to $R_3$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, a to c are each independently an integer of 0 to 3, and $X_1$ to $X_6$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $X_1$ to $X_6$ being separate or combined with an adjacent group to form a ring, provided that at least one pair among $X_1$ and $X_2$, $X_3$ and $X_4$, and $X_5$ and $X_6$ combine to form a group represented by the following Formula 2:

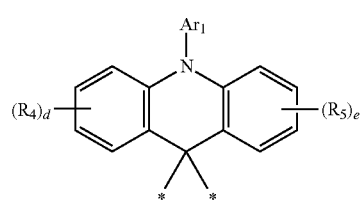

[Formula 2]

wherein, in Formula 2, $R_4$ and $R_5$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_4$ and $R_5$ being separate or combined with an adjacent group to form a ring, d and e are each independently an integer of 0 to 4, $Ar_1$ is a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and * represents a binding site to Formula 1.

The embodiments may be realized by providing a polycyclic compound represented by the following Formula 1:

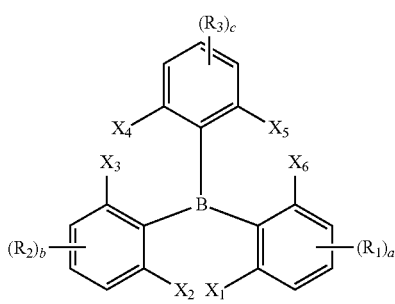

[Formula 1]

wherein, in Formula 1, $R_1$ to $R_3$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms ring, or a substituted or unsubstituted heteroaryl group having 2 to 30 ring carbon atoms, a to c are each independently an integer of 0 to 3, and $X_1$ to $X_6$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $X_1$ to $X_6$ being separate or combined with an adjacent group to form a ring, provided that at least one pair among $X_1$ and $X_2$, $X_3$ and $X_4$, and $X_5$ and $X_6$ combine to form a group represented by the following Formula 2:

[Formula 2]

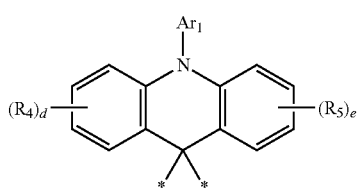

wherein, in Formula 2, $R_4$ and $R_5$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_4$ and $R_5$ being separate or combined with an adjacent group to form a ring, d and e are each independently an integer of 0 to 4, $Ar_1$ is a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and * represents a binding site to Formula 1.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
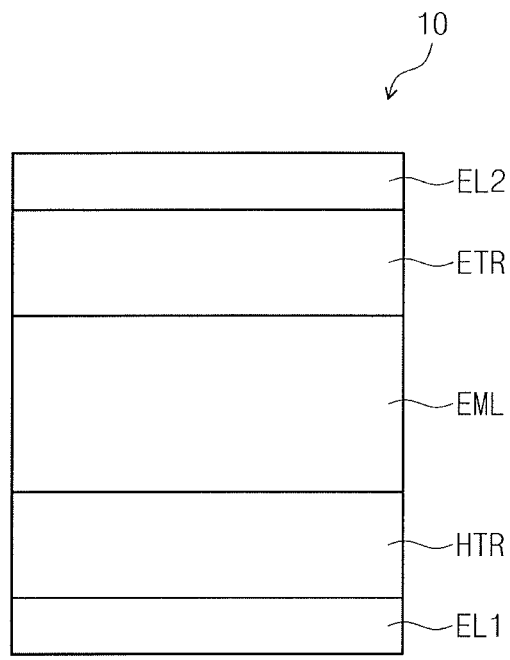
FIG. 1 illustrates a cross-sectional view of an organic electroluminescence device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

Like reference numerals refer to like elements throughout. It will be understood that, although the terms first, second, etc. may be used herein to describe various elements, these elements should not be limited by these terms. These terms are only used to distinguish one element from another element. Thus, a first element could be termed a second element without departing from the teachings herein. Similarly, a second element could be termed a first element. As used herein, the singular forms are intended to include the plural forms as well, unless the context clearly indicates otherwise.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Figure 2:
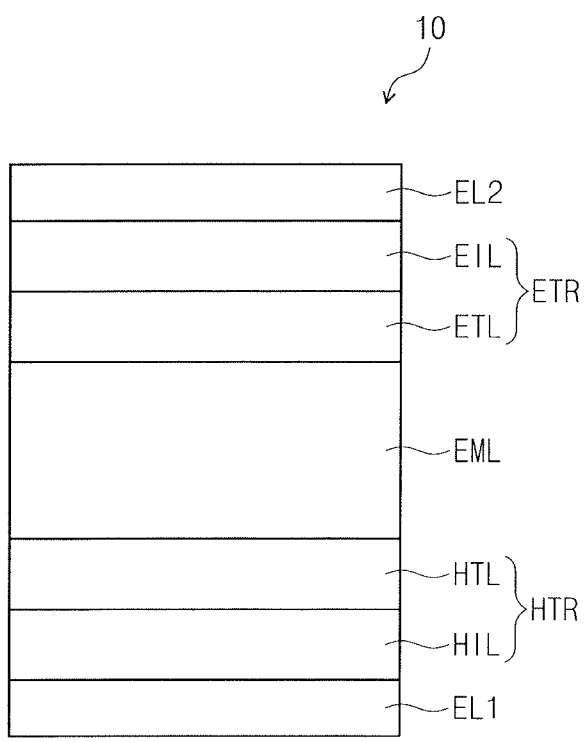
FIG. 2 illustrates a cross-sectional view of an organic electroluminescence device according to an embodiment.
Figure 3:
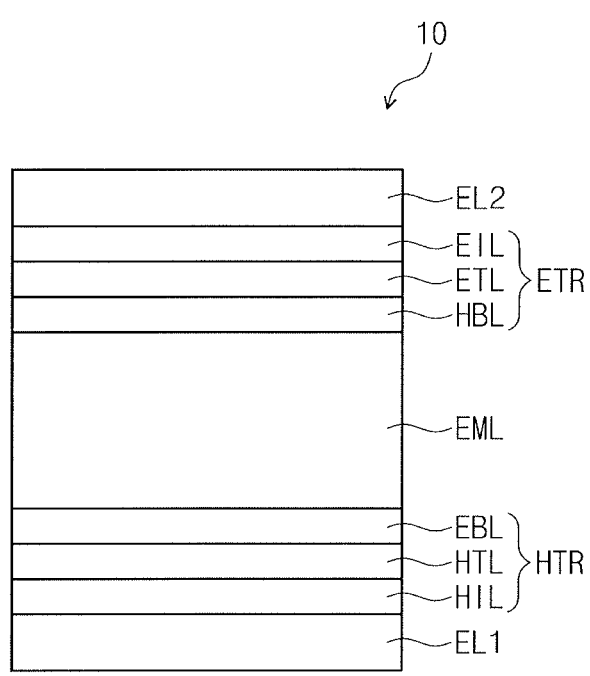
FIG. 3 illustrates a cross-sectional view of an organic electroluminescence device according to an embodiment.

Referring to FIGS. 1 to 3, an organic electroluminescence device 10 according to an embodiment may include a first electrode EL1, a hole transport region HTR, an emission layer EML, an electron transport region ETR and a second electrode EL2, laminated one by one.

The first electrode EL1 and the second electrode EL2 are oppositely disposed from each other, and a plurality of organic layers may be between the first electrode EL1 and the second electrode EL2. The plurality of the organic layers may include a hole transport region HTR, an emission layer EML, and an electron transport region ETR. The organic electroluminescence device 10 of an embodiment may include the polycyclic compound of an embodiment in the emission layer EML.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

In the organic electroluminescence devices 10 of an embodiment, the first electrode EL1 has conductivity. The first electrode EL1 may be formed using a metal alloy or a conductive compound. The first electrode EL1 may be an anode.

The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may include a plurality of layers of ITO/Ag/ITO.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. Alternatively, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL of the organic electroluminescence device 10 of an embodiment may include a known hole injection material. For example, the hole injection layer HIL may include triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4"-tris(3-methyl phenyl phenylamino)triphenylamine (m-MTDATA), N,N'-di(1-naphthyl)-N,N'-diphenylbenzidine (NPB), N,N'-bis(1-naphthyl)-N,N'-diphenyl-4,4'-diamine (α-NPD), 4,4',4"-tris(N,N-diphenylamino)triphenylamine (TDATA), 4,4',4"-tris(N,N-2-naphthyl phenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or dipyrazino[2,3-f:2',3'-h]quinoxaline-2,3,6,7,10,11-hexacarbonitrile (HAT-CN).

The hole transport layer HTL of the organic electroluminescence device 10 of an embodiment may include a known hole transport material. For example, the hole transport layer HTL may include 1,1-bis[(di-4-trileamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphtyl)-N,N'-diphenylbenzidine (NPB), N,N'-bis(1-naphthyl)-N,N'-diphenyl-4,4'-diamine (α-NPD), etc.

Meanwhile, the hole transport region HTR may further include an electron blocking layer EBL, and the electron blocking layer EBL may be disposed between a hole transport layer HTL and an emission layer EML. The electron blocking layer EBL may play the role of preventing electron injection from an electron transport region ETR to a hole transport region HTR.

The electron blocking layer EBL may include a common material known in the art. The electron blocking layer EBL may include, for example, carbazole derivatives such as N-phenylcarbazole, and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), mCP, etc. In an implementation, the electron blocking layer EBL may include the polycyclic compound according to an embodiment.

The thickness of the hole transport region HTR may be from about 100 Å to about 10,000 Å, for example, from about 100 Å to about 5,000 Å. The thickness of the hole injection layer HIL may be, for example, from about 30 Å to about 1.000 Å and the thickness of the hole transport layer HTL may be from about 30 Å to about 1.000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-tetracyanoquinodimethane (F4-TCNQ), metal oxides such as tungsten oxide and molybdenum oxide, without limitation.

As described above, the hole transport region HTR may further include at least one of a hole buffer layer or an electron blocking layer EBL in addition to the hole injection layer HIL and the hole transport layer HTL. The hole buffer layer may compensate a resonance distance according to the wavelength of light emitted from the emission layer EML and increase light emission efficiency. Materials included in the hole transport region HTR may be used as materials included in the hole buffer layer.

The emission layer EML may be on the hole transport region HTR. The emission layer EML may have a thickness of, e.g., about 100 Å to about 600 Å. The emission layer EML may have a single layer formed using a single material, a single layer formed using a plurality of different materials, or a multilayer structure having a plurality of layers formed using a plurality of different materials.

The emission layer EML may emit one of red light, green light, blue light, white light, yellow light, and cyan light. The emission layer EML may include a fluorescence emitting material or a phosphorescence emitting material.

In an implementation, the emission layer EML may be a fluorescence emission layer. For example, a portion of the light emitted from the emission layer EML may be attributed to thermally activated delayed fluorescence (TADF). For example, the emission layer EML may include a light-emitting component that emits thermally activated delayed fluorescence. In an implementation, the emission layer EML may be an emission layer emitting thermally activated delayed fluorescence that emits blue light.

As used herein, -* means a connecting position or a binding site.

As used herein, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

As used herein, the description of forming a ring via the combination with an adjacent group may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the ring formed via the combination with an adjacent group may be combined with another ring to form a Spiro structure.

As used herein, the terms "an adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

As used herein, the halogen atom may be a fluorine atom, a chlorine atom, a bromine atom or an iodine atom.

As used herein, the alkyl may be a linear, branched or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

As used herein, the aryl group means an optional functional group or substituent derived from an aromatic hydrocarbon ring. The aryl group may be a monocyclic aryl group or a polycyclic aryl group. The carbon number for forming a ring in the aryl group may be, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

As used herein, the fluorenyl group may be substituted, and two substituents may be combined with each other to form a spiro structure. Examples of the case where the fluorenyl group is substituted are as follows.

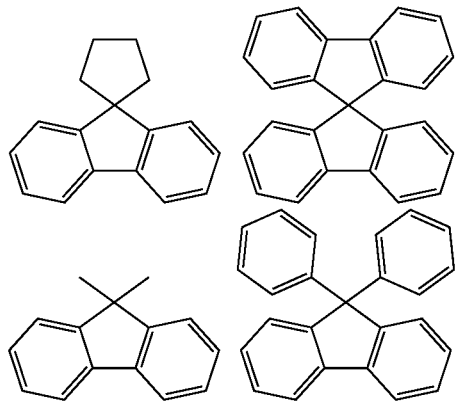

As used herein, the heteroaryl may be a heteroaryl including at least one of O, N, P, Si or S as a heteroatom. The carbon number for forming a ring of the heteroaryl may be 2 to 30, or 2 to 20. The heteroaryl may be monocyclic heteroaryl or polycyclic heteroaryl. Examples of the polycyclic heteroaryl may have a dicyclic or tricyclic structure. Examples of the heteroaryl may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuranyl, phenanthroline, thiazolyl, isooxazolyl, oxadiazolyl, thiadiazolyl, benzothiazolyl, phenothiazinyl, dibenzosilole, dibenzofuran, etc.

As used herein, the silyl group includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc.

As used herein, the carbon number of the amine group may be 1 to 30. The amine group may include an alkyl amine group and an aryl amine group. Examples of the amine group include a methylamine group, a dimethylamine group, a phenylamine group, a naphthylamine group, a 9-methylanthracenylamine group, a triphenylamine group, etc.

In an implementation, an emission layer EML includes a polycyclic compound represented by the following Formula 1.

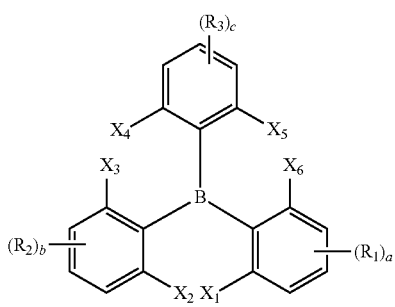

[Formula 1]

In Formula 1, $X_1$ to $X_6$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $X_1$ to $X_6$ may be separate or may be combined with an adjacent group to form a ring.

In Formula 1, $R_1$ to $R_3$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In an implementation, $R_1$ to $R_3$ may not include a boron group (e.g., boron or a boron-containing group). If $R_1$ to $R_3$ were to include a boron group, molecular stability could be deteriorated, and if the heterocyclic compound were applied in a device, the charge balance of an emission layer could be degraded.

"a", "b", and "c" are each independently an integer of 0 to 3. If "a" is 2 or 3, the 2 or 3 $R_1$ groups are the same or different, if "b" is 2 or 3, the 2 or 3 $R_2$ groups are the same or different, and if "c" is 2 or 3, the 2 or 3 $R_3$ groups are the same or different.

In an implementation, in Formula 1, at least one pair among $X_1$ and $X_2$, $X_3$ and $X_4$, and $X_5$ and $X_6$ may make a spiro bond with a nitrogen-containing compound or group. For example, at least one pair among $X_1$ and $X_2$, $X_3$ and $X_4$, and $X_5$ and $X_6$ may combine to form a group represented by the following Formula 2.

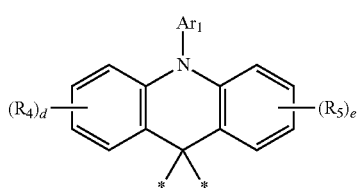

[Formula 2]

In Formula 2, $R_4$ and $R_5$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_4$ and $R_5$ may be separate or may be combined with an adjacent group to form a ring.

In Formula 2, "d" and "e" are each independently an integer of 0 to 4. If "d" is 2, 3, or 4, the 2, 3, or 4 $R_4$ groups are the same or different, and if "e" is, 3, or 4, the 2, 3, or 4 $R_5$ groups are the same or different.

In the compound represented by Formula 1, an electron acceptor (e.g., represented by the general structure of Formula 1) and an electron donor represented by Formula 2 may form one or more Spiro bonds, and the compound may have excellent durability at a high temperature and may not easily be decomposed by heat under high temperature conditions, thereby contributing to the long life of a device.

In addition, the compound represented by Formula 1 may have a fixed structure wherein an electron acceptor obtained by condensing a hexagonal (e.g., 6-membered) ring including boron and two benzene rings, and an electron donor obtained by condensing a hexagonal ring including nitrogen and two benzene rings are orthogonal. For example, the compound represented by Formula 1 may have separated HOMO and LUMO, and the electron donor and the electron acceptor each may effectively function, and thus, the compound may be appropriate as a material for emitting thermally activated delayed fluorescence. In addition, the compound represented by Formula 1 may have a rigid structure, and a half width decreases to from about 50 nm to about 60 nm, thereby contributing to the increase of the efficiency of a device.

In Formula 2, $Ar_1$ may be or may include, e.g., a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In an implementation, $Ar_1$ in Formula 2 may be, e.g., a substituted or unsubstituted aryl group having 6 to 30 ring carbon atoms or a substituted or unsubstituted heteroaryl group having 2 to 30 ring carbon atoms.

In an implementation, An in Formula 2 may be a group represented by one of the following $Ar_1$-1 to $Ar_1$-3.

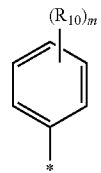

$Ar_1$-1

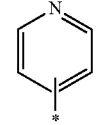

$Ar_1$-2

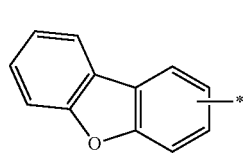

$Ar_1$-3

In Ar$_1$-1, R$_{10}$ may be, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In Ar$_1$-1, "m" may be an integer of 0 to 4. If "m" is 2, 3, or 4, the 2, 3, or 4 R$_{10}$ groups are the same or different.

In an implementation, X$_1$ to X$_6$ in Formula 1 may be each independently combined with an adjacent group to form a hexagonal ring including boron.

In an implementation, if one or more among X$_1$ to X$_6$ are combined with an adjacent group to form a ring, Formula 1 may be represented by the following Formula 1-1.

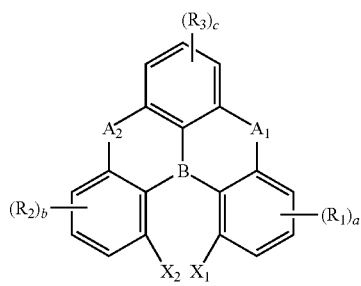

[Formula 1-1]

In Formula 1-1, A$_1$ and A$_2$ may each independently be, e.g., a direct linkage, NR$_{11}$, O, S, SiR$_{12}$R$_{13}$, or CR$_{14}$R$_{15}$.

In Formula 1-1, R$_{11}$ to R$_{15}$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. R$_1$ to R$_3$, and "a" to "c" may be the same as defined in Formula 1.

In Formula 1-1, X$_1$ and X$_2$ may form the group represented by Formula 2.

In an implementation, if one or more among X$_1$ to X$_6$ in Formula 1 are combined with an adjacent group to form a ring, Formula 1 may be represented by the following Formula 1-2:

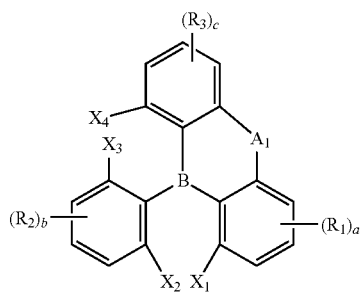

[Formula 1-2]

In Formula 1-2, A$_1$ may be, e.g., a direct linkage, NR$_{11}$, O, S, SiR$_{12}$R$_{13}$, or CR$_{14}$R$_{15}$.

In Formula 1-2, R$_{11}$ to R$_{15}$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In Formula 1-2, X$_1$ to X$_4$, R$_1$ to R$_3$, and "a" to "c" may be the same as defined in Formula 1.

In Formula 1-2, at least one pair among X$_1$ and X$_2$, and X$_3$ and X$_4$, may form the group represented by Formula 2.

In an implementation, if "d" and "e" in Formula 2 are 1, 2, 3, or 4, R$_4$ and R$_5$ may be separate or may be combined with an adjacent group to form a hexagonal ring including nitrogen.

In an implementation, if R$_4$ and R$_5$ in Formula 2 are combined with an adjacent group to form a ring, the group represented by Formula 2 may be represented by the following Formula 2-1.

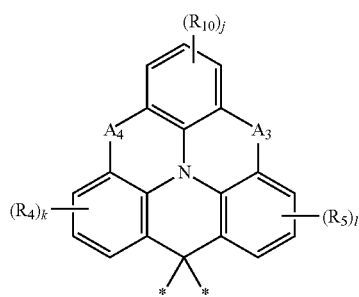

[Formula 2-1]

In Formula 2-1, A$_3$ and A$_4$ may each independently be, e.g., a direct linkage, NR$_{17}$, O, S, SiR$_{18}$R$_{19}$, or CR$_{20}$R$_{21}$.

In Formula 2-1, R$_{10}$ may be or may include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In Formula 2-1, "j" to "l" may each independently be, e.g., an integer of 0 to 3. Meanwhile, if "j" is 2 or 3, the 2 or 3 R$_{10}$ groups are the same or different, if "k" is 2 or 3, the 2 or 3 R$_4$ groups are the same or different, and if "l" is 2 or 3, the 2 or 3 R$_5$ groups are the same or different. In an implementation, "k" and "l" in Formula 2-1 may be integers smaller by one than "d" and "e" in Formula 2. For example, if "d" and "e" are 1, "k" and "l" are 0.

In Formula 2-1, R$_{17}$ to R$_{21}$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms. In an implementation, R$_{17}$ to R$_{21}$ may be separate or may be combined with an adjacent group to form a ring.

In Formula 2-1, $R_4$, and $R_5$ may be the same as defined in Formula 2.

In an implementation, if $R_5$ in Formula 2 is combined with an adjacent group to form a ring, the group represented by Formula 2 may be represented by the following Formula 2-2.

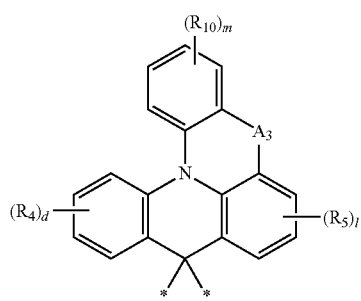

[Formula 2-2]

In Formula 2-2, $A_3$ may be, e.g., a direct linkage, $NR_{17}$, O, S, $SiR_{18}R_{19}$, or $CR_{20}R_{21}$.

In Formula 2-2, $R_{10}$ may be or may include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In Formula 2-2, "l" is an integer of 0 to 3. If "l" is 2 or 3, the 2 or 3 $R_5$ groups are the same or different. In an implementation, "l" in Formula 2-2 may be an integer smaller by one than "e" in Formula 2. For example, if "e" is 1, "l" is 0.

In Formula 2-2, "m" is an integer of 0 to 4. If "m" is 2, 3, or 4, the 2, 3, or 4 $R_{10}$ groups are the same or different.

In Formula 2-2, $R_{17}$ to $R_{21}$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, or may be combined with an adjacent group to form a ring.

In Formula 2-2, $R_4$, $R_5$, and "d" may be the same as defined in Formula 2.

In an implementation, Formula 1 may make a spiro bond with a nitrogen-containing group to form a group represented by Formula 2. In an implementation, the compound represented by Formula 1 may be represented by the following Formula 3.

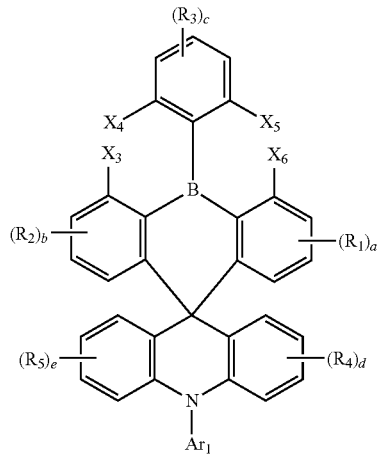

[Formula 3]

In Formula 3, $X_3$ to $X_6$, $R_1$ to $R_5$, $Ar_1$, and "a" to "e" are the same as defined in Formula 1 and Formula 2.

In an implementation, the compound represented by Formula 3 may be represented by the following Formula 3-1 or 3-2.

[Formula 3-1]

[Formula 3-2]

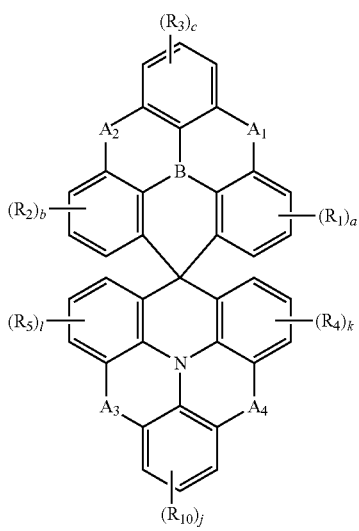

In Formula 3-1 and 3-2, $A_1$ to $A_4$ may each independently be, e.g., a direct linkage, $NR_{23}$, O, S, $SiR_{24}R_{25}$, or $CR_{26}R_{27}$.

In Formula 3-1 and 3-2, $R_{10}$ may be or may include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In Formulae 3-1 and 3-2, "j" to "l" may each independently be an integer of 0 to 3. If "j" is 2 or 3, the 2 or 3 $R_{10}$ groups are the same or different, if "k" is 2 or 3, the 2 or 3 $R_4$ groups are the same or different, and if "l" is 2 or 3, the 2 or 3 $R_5$ groups are the same or different. In an implementation, "k" and "l" in Formula 2-1 may be an integer smaller by one than "d" and "e" in Formula 2. For example, if "d" and "e" are 1, "k" and "l" are 0.

In Formulae 3-1 and 3-2, $R_{23}$ to $R_{27}$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms. In an implementation, $R_{23}$ to $R_{27}$ may be separate or combined with an adjacent group to form a ring. $R_1$ to $R_5$, $Ar_1$, and "a" to "e" may be the same as defined in Formula 3.

In an implementation, Formula 1 may make a spiro bond with a nitrogen-containing group to form the group represented by Formula 2. In an implementation, the compound represented by Formula 1 may be represented by the following Formula 4.

[Formula 4]

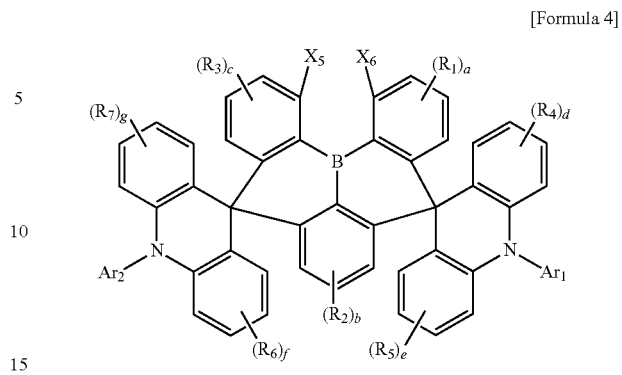

In Formula 4, $R_6$ and $R_7$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms. In an implementation, $R_6$ and $R_7$ may be separate or combined with an adjacent group to form a ring.

In Formula 4, "f" and "g" may each independently be, e.g., an integer of 0 to 4. If "f" is 2, 3, or 4, the 2, 3, or 4 $R_6$ groups are the same or different, and if "g" is 2, 3, or 4, the 2, 3, or 4 $R_7$ groups are the same or different.

In Formula 4, $Ar_2$ may be or may include, e.g., a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In Formula 4, $X_5$, $X_6$, $R_1$ to $R_5$, $Ar_1$, and "a" to "e" may be the same as defined in Formula 1 and Formula 2.

In an implementation, the compound represented by Formula 4 may be represented by the following Formula 4-1.

[Formula 4-1]

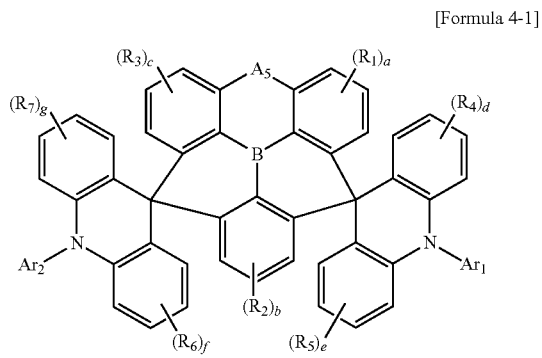

In Formula 4-1, $A_5$ may be, e.g., a direct linkage, $NR_{29}$, O, S, $SiR_{30}R_{31}$, or $CR_{32}R_{33}$.

In Formula 4-1, $R_{29}$ to $R_{33}$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms. In an implementation, $R_{29}$ to $R_{33}$ may be separate or combined with an adjacent group to form a ring. $R_1$ to $R_7$, $Ar_1$, $Ar_2$, and "a" to "g" may be the same as defined in Formula 4.

In an implementation, Formula 1 may make three Spiro bonds with nitrogen-containing groups to form three groups represented by Formula 2. In an implementation, the compound represented by Formula 1 may be represented by Formula 5.

[Formula 5]

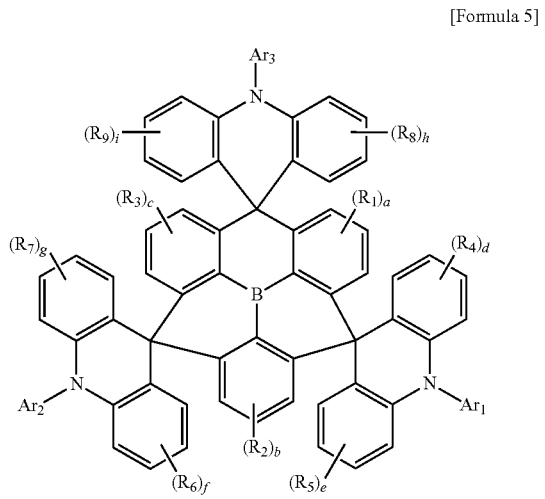

In Formula 5, $R_6$ to $R_9$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms. In an implementation, $R_6$ to $R_9$ may be separate or combined with an adjacent group to form a ring.

In Formula 5, "f" to "i" may each independently be, e.g., an integer of 0 to 4. If "f" is 2, 3, or 4, the 2, 3, or 4 $R_6$ groups are the same or different, if "g" is 2, 3, or 4, the 2, 3, or 4 $R_7$ groups are the same or different, if "h" is 2, 3, or 4, the 2, 3, or 4 $R_8$ groups are the same or different, and if "i" is 2, 3, or 4, the 2, 3, or 4 $R_9$ groups are the same or different.

In Formula 5, $Ar_2$ and $Ar_3$ may each independently be or include, e.g., a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. $R_1$ to $R_5$, $Ar_1$, and "a" to "e" may be the same as defined in Formula 1 and Formula 2.

The compound represented by Formula 1 may be a material for emitting delayed fluorescence. The compound represented by Formula 1 may be a material for thermally activated delayed fluorescence.

The compound represented by Formula 1 may have the absolute value (ΔEst) of a difference between a singlet energy level (S1) and a triplet energy level (T1) of about 0.2 eV or less. For example, S1−T1=0.2 eV.

For example, the compound represented by Formula 1 may have a small difference between a singlet energy level (S1) and a triplet energy level (T1), and may be used as a material for emitting thermally activated delayed fluorescence. For example, the polycyclic compound represented by Formula 1 may be a blue emitting material emitting thermally activated delayed fluorescence. In an implementation, the compound represented by Formula 1 may be used as a material for thermally activated delayed fluorescence, which emits green light or red light.

The polycyclic compound represented by Formula 1 may be a compound of the following Compound Group 1:

[Compound Group 1]

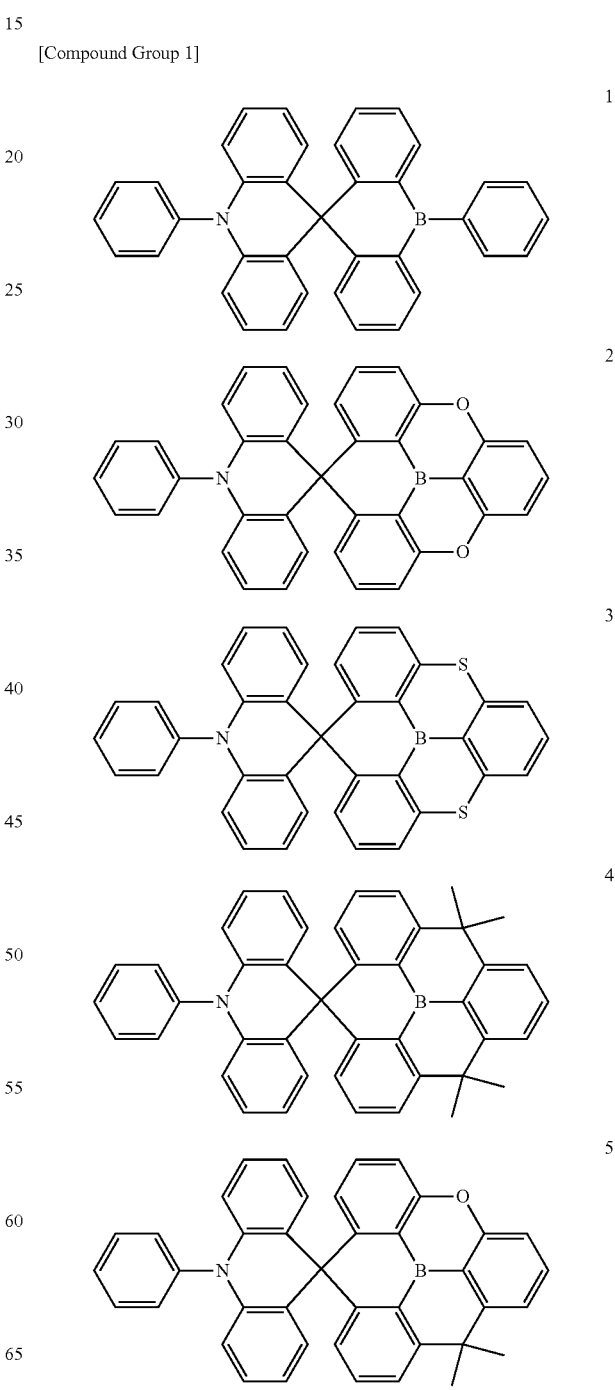

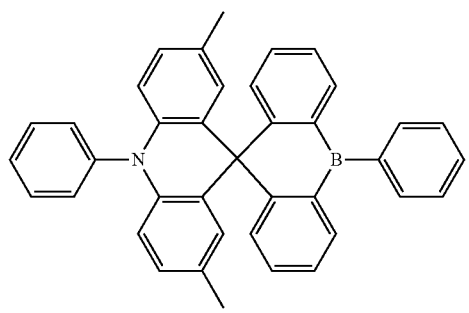
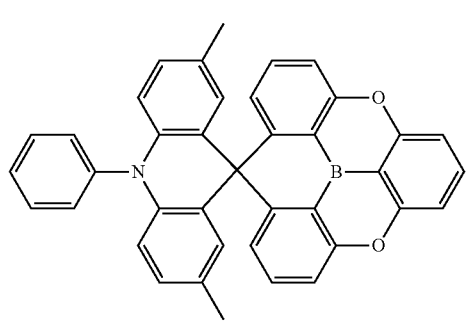
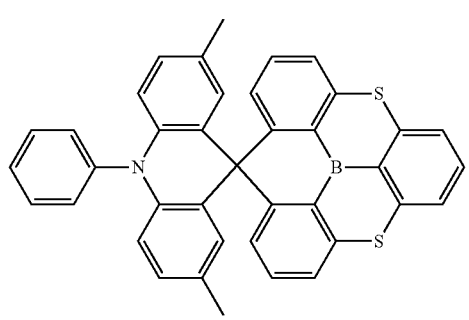
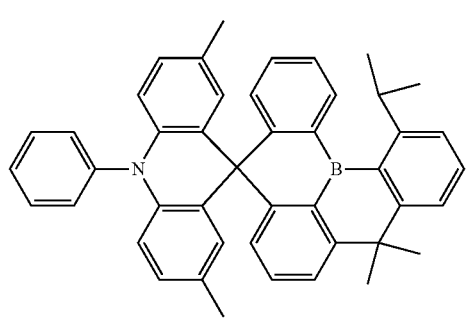
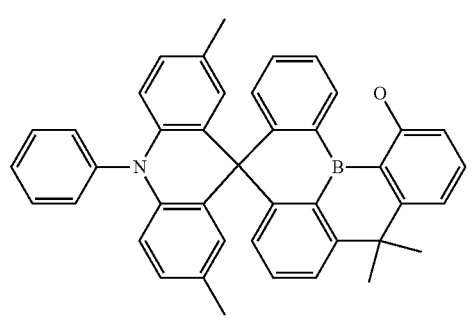
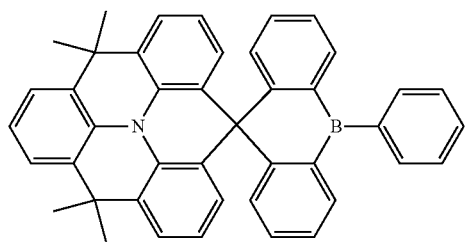
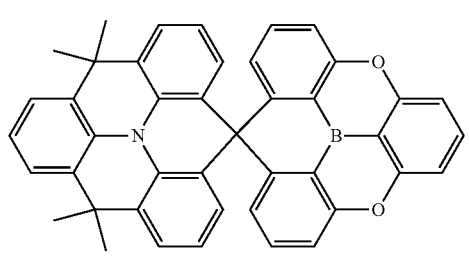
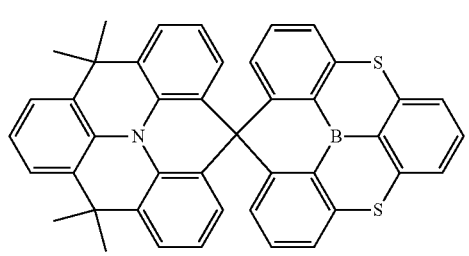
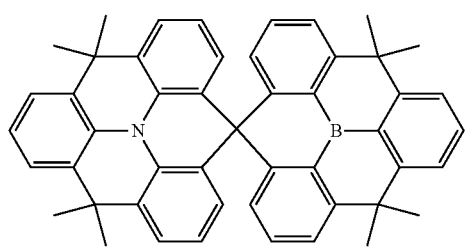
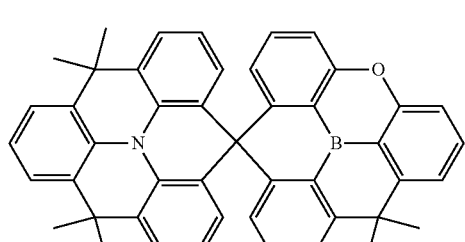
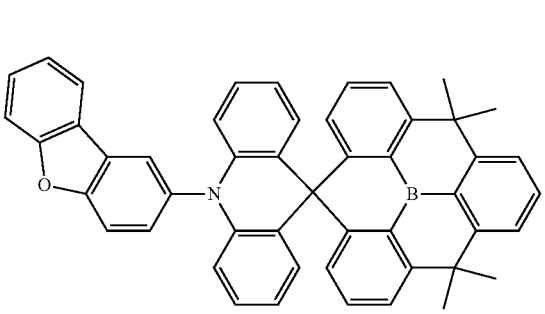

17
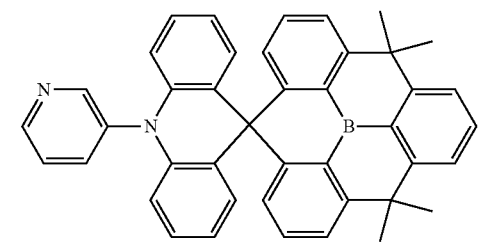
18
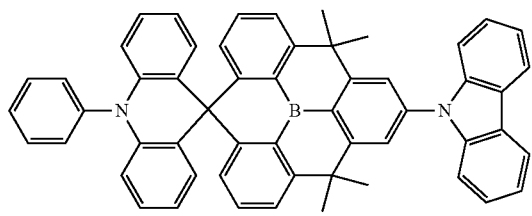
19
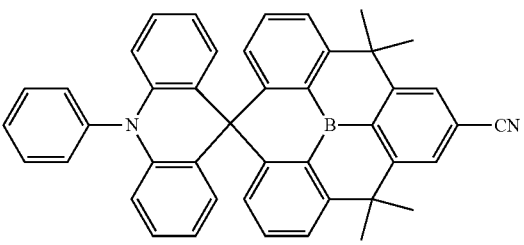
20
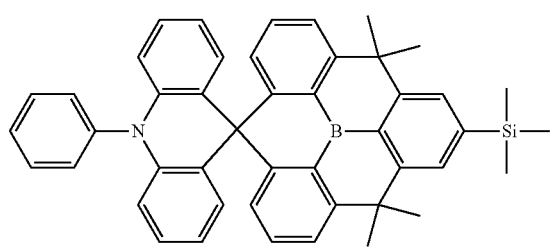
21
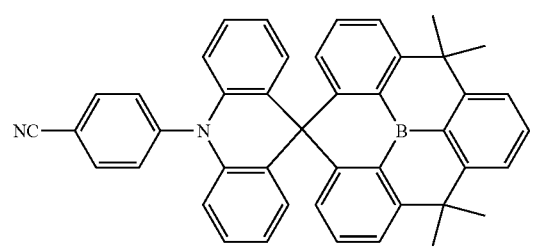
22
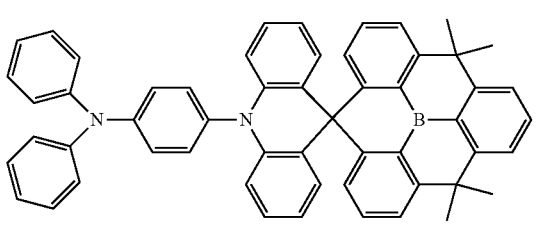
23
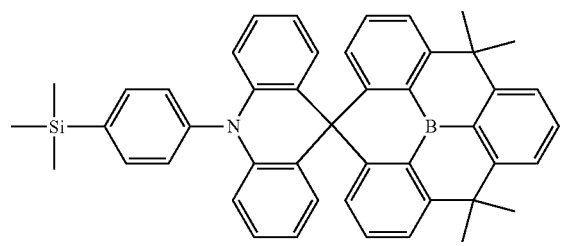
24
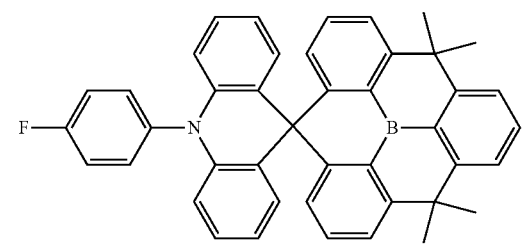
25
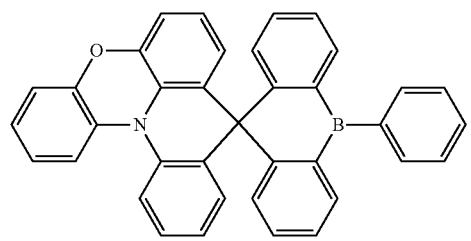
26
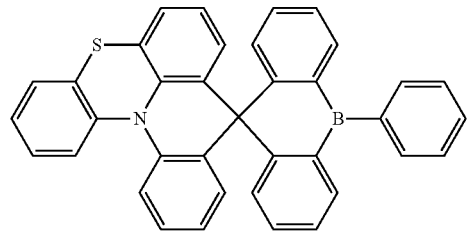
27
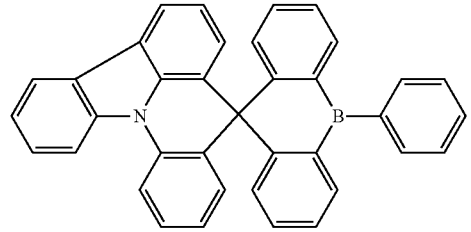
28
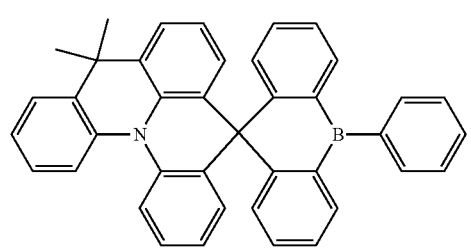

29
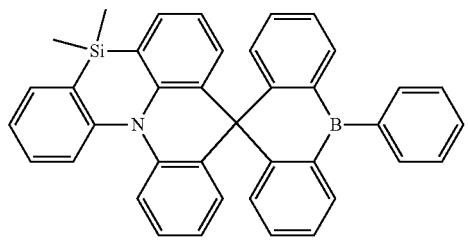
30
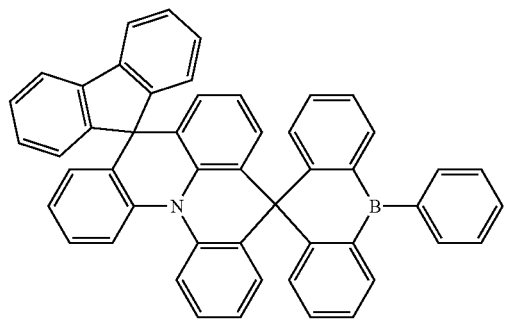
31
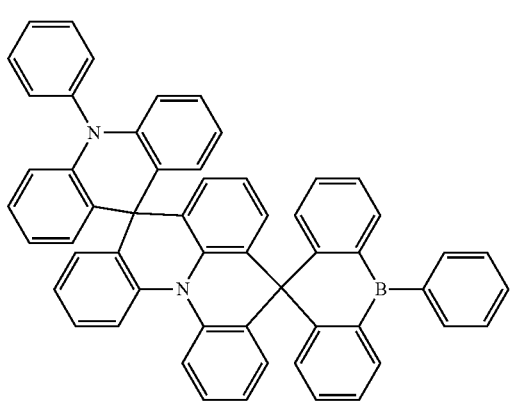
32
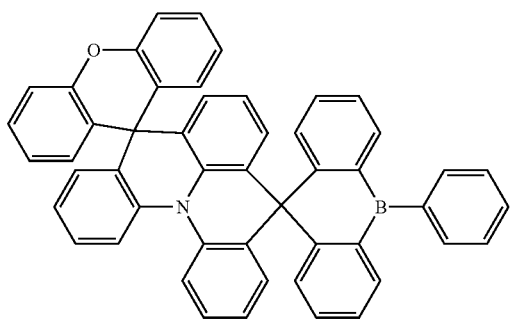
33
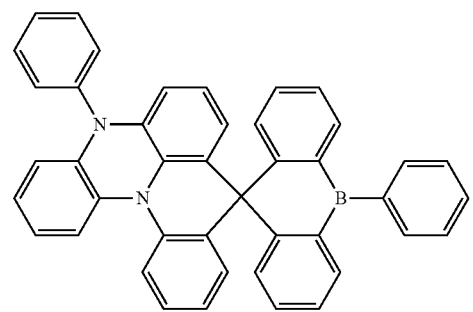
34
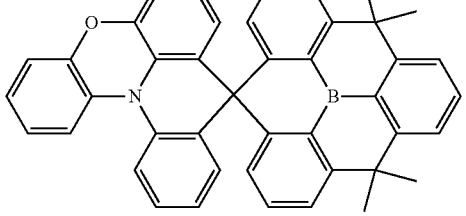
35
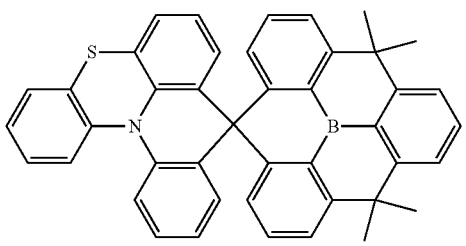
36
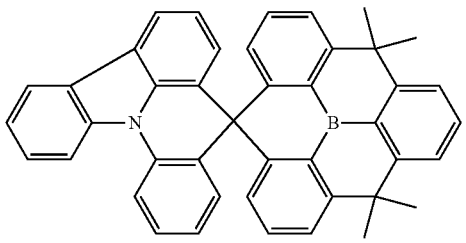
37
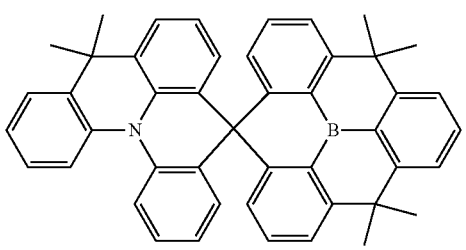
38
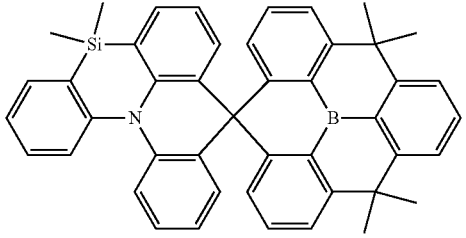
39
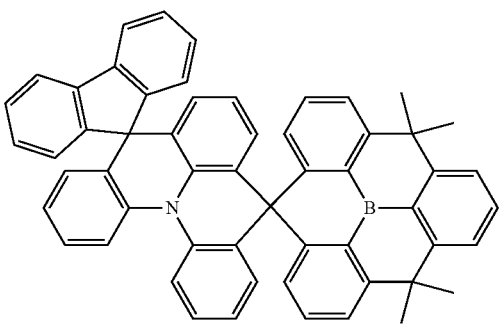

40
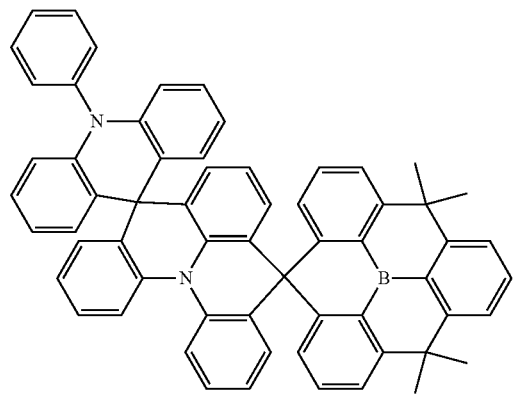
41
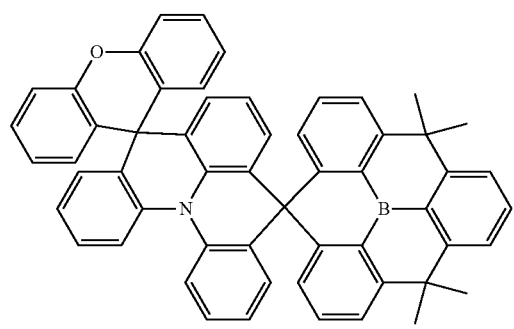
42
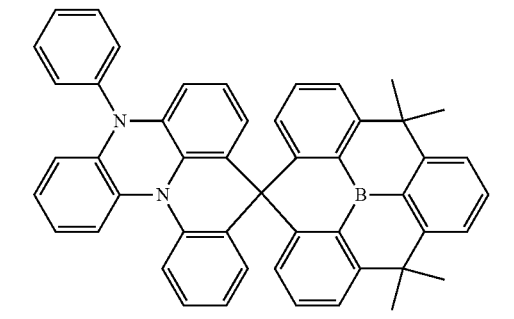
43
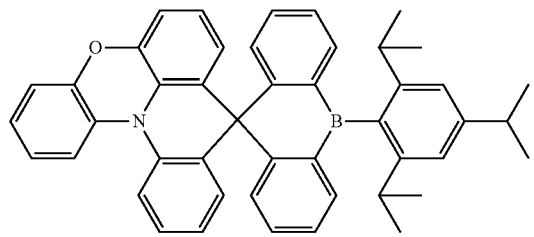
44
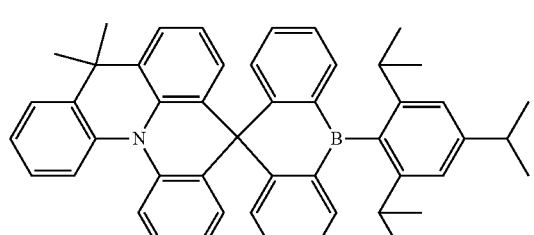
45
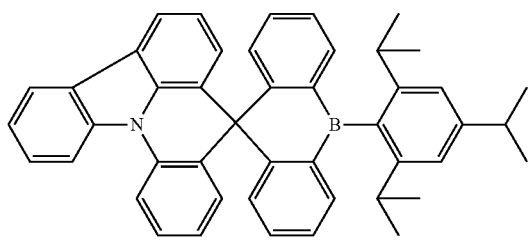
46
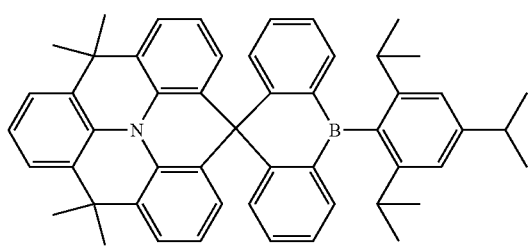
47
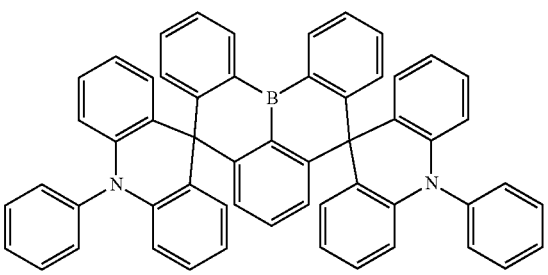
48
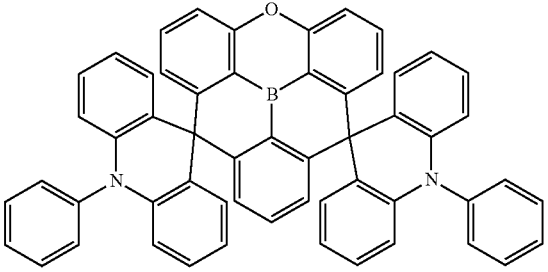
49

50
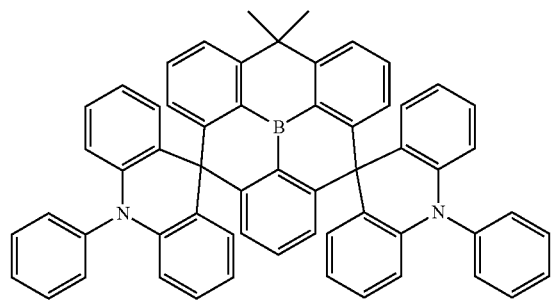
51
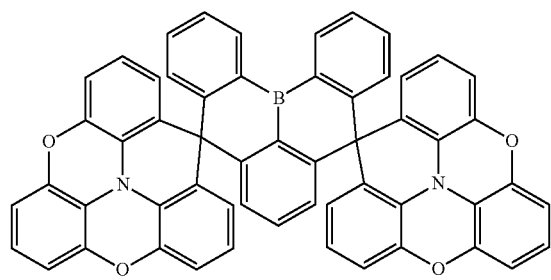
52
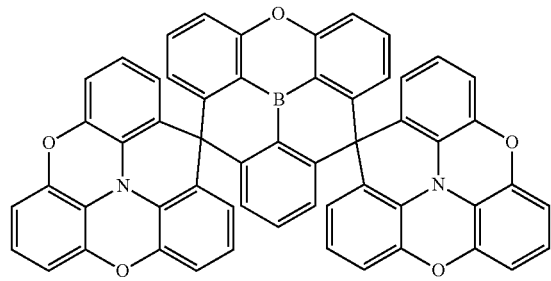
53
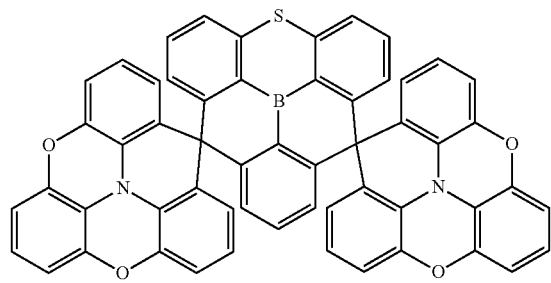
54
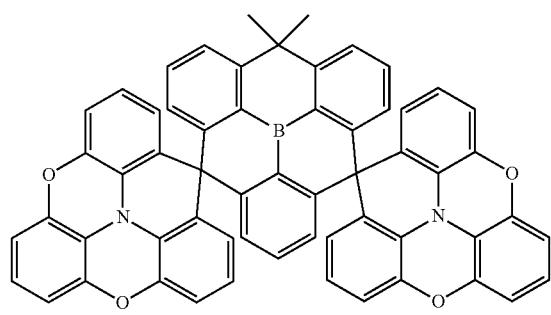
55
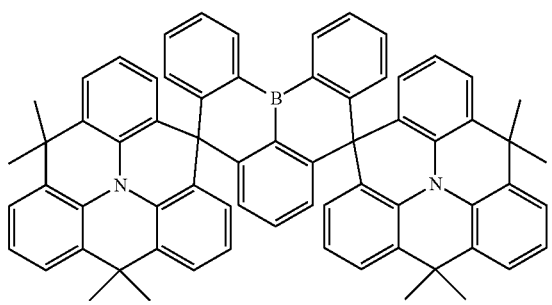
56
57
58
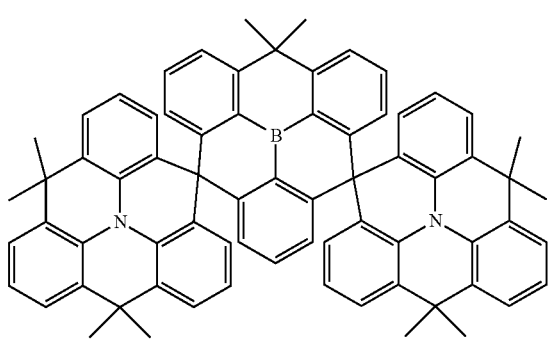

59

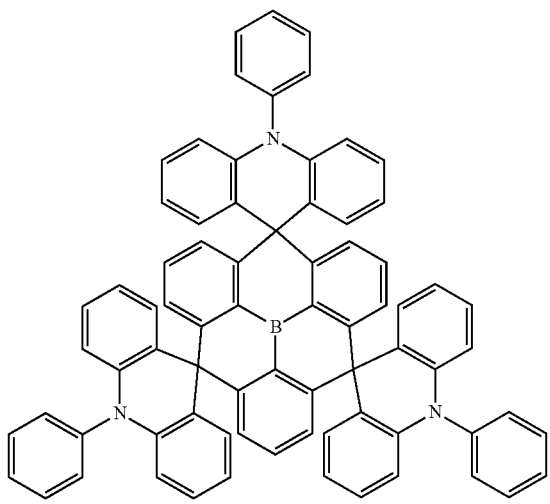

60

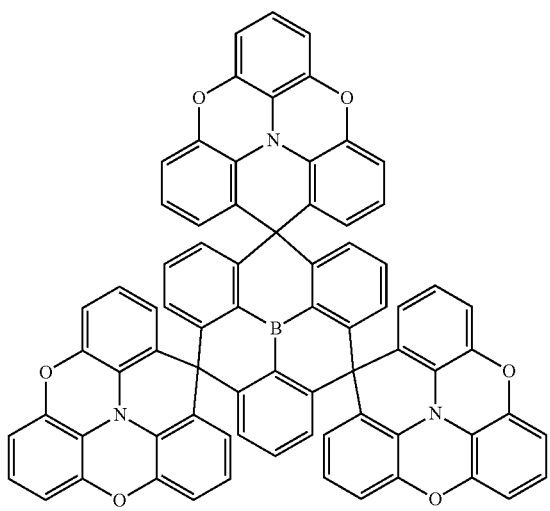

61

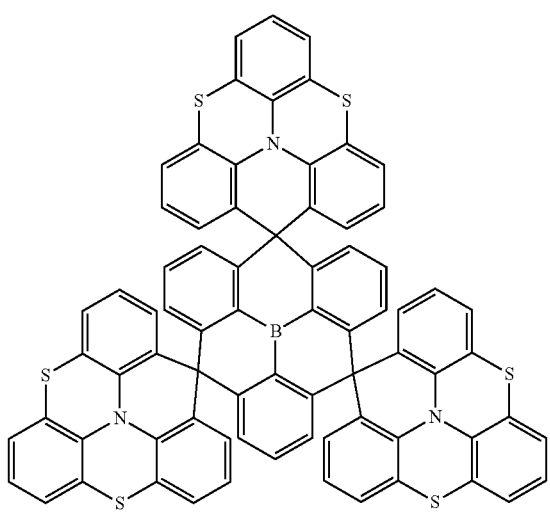

62

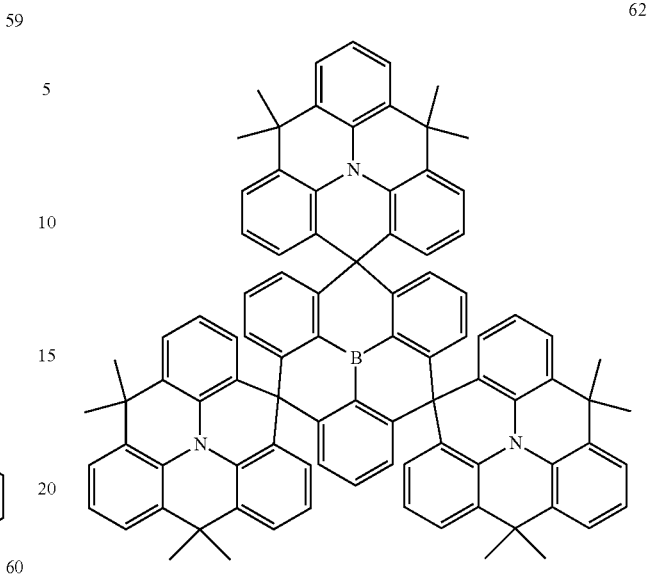

The polycyclic compound represented by Formula 1 may be used in an organic electroluminescence device 10 and may help improve the efficiency and life of the organic electroluminescence device. For example, the polycyclic compound represented by Formula 1 may be used in the emission layer EML of an organic electroluminescence device 10 and may help improve the emission efficiency and life of the organic electroluminescence device.

In an implementation, the emission layer EML may include a host and a dopant, and the host may be a host for emitting delayed fluorescence and the dopant may be a dopant for emitting delayed fluorescence. In an implementation, the polycyclic compound represented by Formula 1 may be included as a dopant material of an emission layer EML. For example, the polycyclic compound represented by Formula 1 may be used as a TADF dopant. For example, the dopant may be included in an amount less than that of the host.

In an implementation, the emission layer EML may include a suitable host material. In an implementation, the emission layer EML may include as a host material, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. A suitable host material for emitting delayed fluorescence may be included.

In an implementation, in the organic electroluminescence device 10 of an embodiment, the emission layer EML may further include a dopant material. In an implementation, the emission layer EML may include as a dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-

(diphenylamino)styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

Referring to FIGS. 1 to 3 again, in the organic electroluminescence device 10 of an embodiment, the electron transport region ETR may be provided on the emission layer EML. The electron transport region ETR may include at least one of an electron blocking layer, an electron transport layer ETL or an electron injection layer EIL.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL. The thickness of the electron transport region ETR may be, for example, from about 100 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl)anthracene (ADN), or a mixture thereof.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include, for example, LiF, lithium quinolate (LiQ), $Li_2O$, BaO, NaCl, CsF, a metal in lanthanoides such as Yb, or a metal halide such as RbCl, RbI and KI. The electron injection layer EIL also may be formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates.

If the electron transport region ETR includes the electron injection layer EIL, the thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer may include, for example, at least one of 2,9-dimethyl-4,7-diphenyl-1,10-phenanthroline (BCP), or 4,7-diphenyl-1,10-phenanthroline (Bphen).

The second electrode EL2 is provided on the electron transport region ETR. The second electrode EL2 has conductivity. The second electrode EL2 may be formed using a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt. Pd. Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In an implementation, the second electrode EL2 may be connected with an auxiliary electrode. If the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission type, the first electrode EL1 may be a reflective electrode and the second electrode EL2 may be a transmissive electrode or a transflective electrode. If the organic electroluminescence device 10 is a bottom emission type, the first electrode EL1 may be a transmissive electrode or a transflective electrode and the second electrode EL2 may be a reflective electrode.

The organic electroluminescence device 10 of an embodiment may use the polycyclic compound as a material for an emission layer and may have improved light-emitting efficiency and life characteristics.

An embodiment may provide a polycyclic compound represented by the following Formula 1.

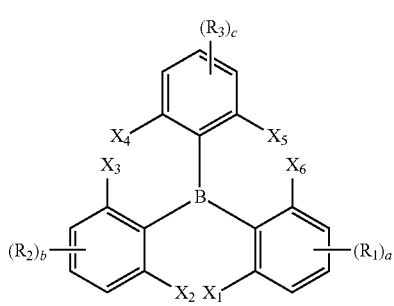

In Formula 1, $X_1$ to $X_6$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms. In an implementation, $X_1$ to $X_6$ may be separate or combined with an adjacent group to form a ring.

In Formula 1, $R_1$ to $R_3$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In an implementation, $R_1$ to $R_3$ may not include a boron group. If $R_1$ to $R_3$ were to include a boron group, molecular stability could be deteriorated, and the charge balance of an emission layer could be degraded.

"a", "b", and "c" may each independently be, e.g., an integer of 0 to 3. If "a" is 2 or 3, the 2 or 3 $R_1$ groups are the same or different, if "b" is 2 or 3, the 2 or 3 $R_2$ groups are the same or different, and if "c" is 2 or 3, the 2 or 3 $R_3$ groups are the same or different.

In Formula 1, at least one pair among $X_1$ and $X_2$, $X_3$ and $X_4$, and $X_5$ and $X_6$ may make a spiro bond with a nitrogen-containing group, e.g., to form a group represented by the following Formula 2.

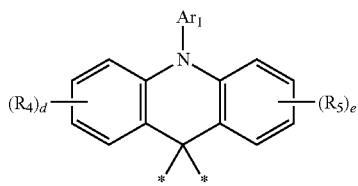

In Formula 2, $R_4$ and $R_5$ may each independently be or include, e.g., a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms. In an implementation, $R_4$ and $R_5$ may be separate or may be combined with an adjacent group to form a ring.

In Formula 2, "d" and "e" may each independently be, e.g., an integer of 0 to 4. If "d" is 2, 3, or 4, the 2, 3, or 4 f $R_4$ groups are the same or different, and if "e" is 2, 3, or 4, the 2, 3, or 4 $R_5$ groups are the same or different.

The same explanation on the polycyclic compound in the organic electroluminescence device of an embodiment may be applied to the polycyclic compound of an embodiment, represented by Formula 1.

The polycyclic compound according to an embodiment may be any one selected from the compounds of Compound Group 1.

The following Examples and Comparative Examples are provided in order to highlight characteristics of one or more embodiments, but it will be understood that the embodiments are not limited to the particular details described in the Examples and Comparative Examples.

EXAMPLES

1. Synthesis of Polycyclic Compounds

First, the synthetic methods of the polycyclic compounds according to exemplary embodiments will be particularly explained referring to the synthetic methods of Compound 4, Compound 14, Compound 49, and Compound 50.

(Synthesis of Compound 4)

Compound 4 was synthesized by the following Reaction 1:

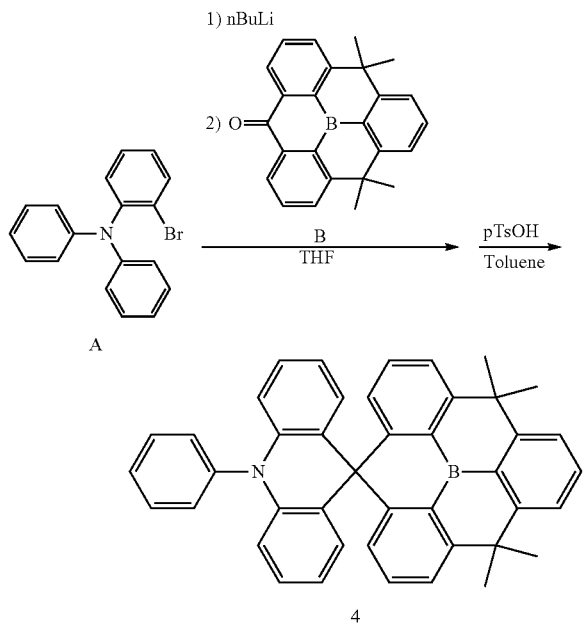

Under an Ar atmosphere, to a 500 ml, three-neck flask, Compound A (5.00 g) was put and dissolved in dehydrated THF (70 ml), and n-butyllithium (nBuLi, 1.6 M in hexane, 9.6 ml) was added dropwise thereto at about −78° C. After stirring at about −78° C. for about 1 hour, a THF solution (70 ml) of Compound B (5.37 g) was added dropwise thereto, followed by stirring for about 16 hours while gradually increasing the temperature to ambient temperature. Water was added to the resultant product, and an organic layer was extracted with $CH_2Cl_2$, separated, and dried with $MgSO_4$. Solvents were removed by distillation under a reduced pressure. The crude product thus obtained was dissolved in toluene (50 ml), and p-toluenesulfonic acid monohydrate (pTsOH, 8.8 g) was added thereto, followed by heating and stirring at about 80° C. for about 6 hours. After the reaction, a precipitate thus produced was obtained by filtering and separated by recrystallization to obtain 5.33 g (yield 60%) of Compound 4. The molecular weight of a target material measured by FAB-MS was 575. From the result, the target product was identified as Compound 4.

(Synthesis of Compound 14)

Compound 14 was synthesized by the following Reaction 2:

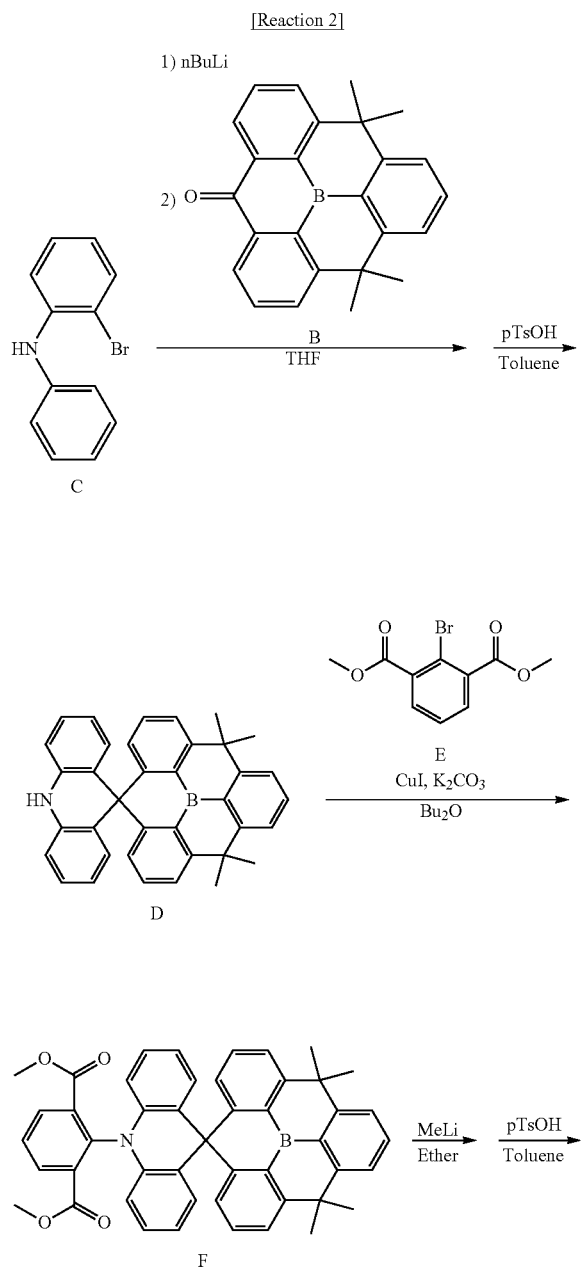

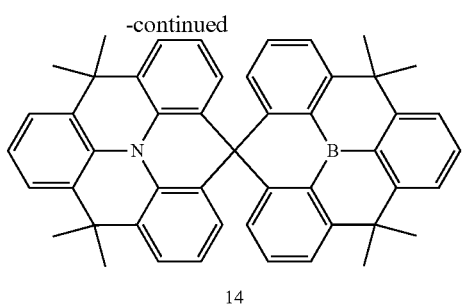

14

Under an Ar atmosphere, to a 500 ml, three-neck flask, Compound C (5.00 g) was put and dissolved in dehydrated THF (100 ml), and nBuLi (1.6 M in hexane, 12.6 ml) was added dropwise thereto at about −78° C. After stirring at about −78° C. for about 1 hour, a THF solution (100 ml) of B (7.01 g) was added dropwise thereto, followed by stirring for about 16 hours while gradually increasing the temperature to ambient temperature. Water was added to the resultant product, and an organic layer was extracted with $CH_2Cl_2$, separated, and dried with $MgSO_4$. Solvents were removed by distillation under a reduced pressure. The crude product thus obtained was dissolved in toluene (100 ml), and pTsOH (11.5 g) was added thereto, followed by heating and stirring at about 80° C. for about 6 hours. After the reaction, a precipitate thus produced was obtained by filtering and separated by recrystallization to obtain 6.24 g (yield 62%) of Intermediate D. The molecular weight of Intermediate D measured by FAB-MS was 499.

Under an Ar atmosphere, to a 500 ml, three-neck flask, Intermediate D (5.00 g), Compound E (2.73 g), copper(I) iodide (CuI, 0.19 g), and potassium carbonate ($K_2CO_3$, 2.76 g) were put and dissolved in dibutyl ether ($Bu_2O$, 100 ml), followed by heating and stirring at about 150° C. for about 48 hours. Water was added to the resultant product, and an organic layer was extracted with $CH_2Cl_2$, separated, and dried with $MgSO_4$. Solvents were removed by distillation under a reduced pressure. The crude product thus obtained was separated by silica gel column chromatography to obtain 5.26 g (yield 76%) of Intermediate F. The molecular weight of Intermediate F measured by FAB-MS was 691.

Under an Ar atmosphere, to a 500 ml, three-neck flask, Intermediate F (5.00 g) was put and dissolved in dehydrated diethyl ether (100 ml), and methyllithium (MeLi, 1.0 M in diethyl ether, 28.9 ml) was added dropwise thereto at about −78° C. After stirring at about −78° C. for about 1 hour, stirring was continued for about 16 hours while gradually increasing the temperature to ambient temperature. Water was added to the resultant product, and an organic layer was extracted with $CH_2Cl_2$, separated, and dried with $MgSO_4$. Solvents were removed by distillation under a reduced pressure. The crude product thus obtained was dissolved in toluene (100 ml), and pTsOH (6.9 g) was added thereto, followed by heating and stirring at about 80° C. for about 6 hours. After the reaction, a precipitate thus produced was obtained by filtering and separated by recrystallization to obtain 2.61 g (yield 55%) of Compound 14. The molecular weight of a target material measured by FAB-MS was 655. From the result, the target product was identified as Compound 14.

(Synthesis of Compound 49)
Compound 49 was synthesized by the following Reaction 3:

[Reaction 3]

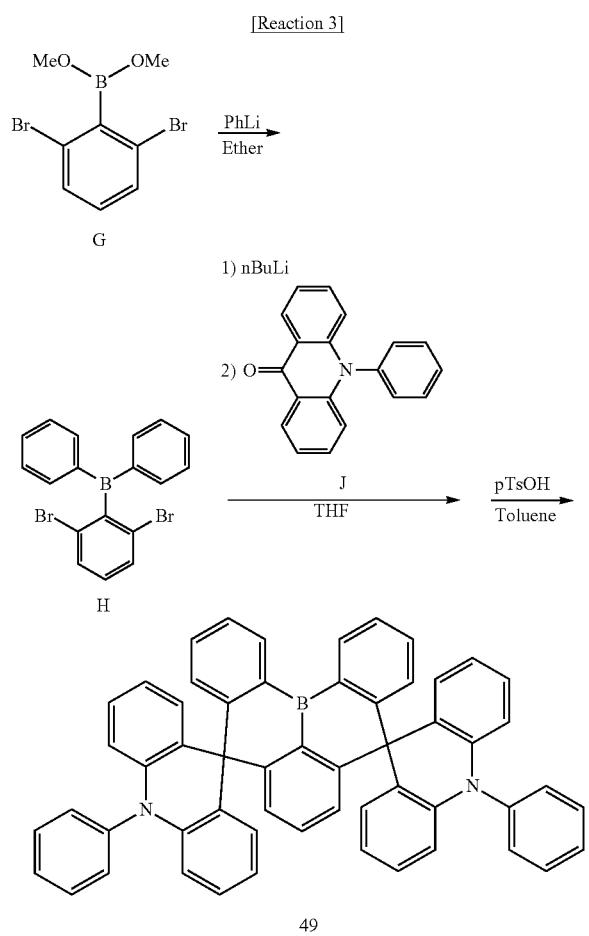

product thus obtained was dissolved in toluene (70 ml), and pTsOH (11.0 g) was added thereto, followed by heating and stirring at about 80° C. for about 6 hours. After the reaction, a precipitate thus produced was obtained by filtering and separated by recrystallization to obtain 3.65 g (yield 39%) of Compound 49. The molecular weight of a target material measured by FAB-MS was 748. From the result, the target product was identified as Compound 49.

(Synthesis of Compound 50)
Compound 50 was synthesized by the following Reaction 4:

[Reaction 4]

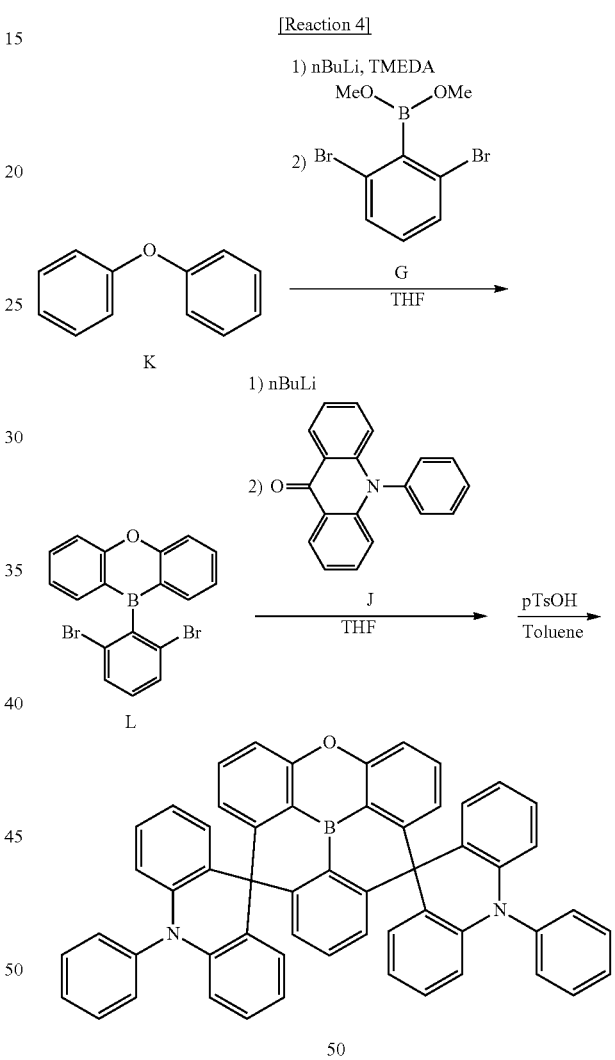

Under an Ar atmosphere, to a 1 L, three-neck flask, Compound G (10.00 g) was put and dissolved in diethyl ether (200 ml), and phenyllitium (PhLi, 1.0 M in cyclohexane-diethyl ether, 65 ml) was added dropwise thereto at about −78° C. After stirring at about −78° C. for about 1 hour, stirring was continued for about 16 hours while gradually increasing the temperature to ambient temperature. Water was added to the resultant product, and an organic layer was extracted with CH$_2$Cl$_2$, separated, and dried with MgSO$_4$. Solvents were removed by distillation under a reduced pressure. The crude product thus obtained was separated by silica gel column chromatography to obtain 8.45 g (yield 65%) of Intermediate H. The molecular weight of Intermediate H measured by FAB-MS was 399.

Under an Ar atmosphere, to a 500 ml, three-neck flask, Intermediate H (5.00 g) was put and dissolved in dehydrated THF (100 ml), and nBuLi (1.6 M in hexane, 15.6 ml) was added dropwise thereto at about −78° C. After stirring at about −78° C. for about 1 hour, a THF solution (100 ml) of Compound J (6.78 g) was added dropwise thereto, followed by stirring for about 16 hours while gradually increasing the temperature to ambient temperature. Water was added to the resultant product, and an organic layer was extracted with CH$_2$Cl$_2$, separated, and dried with MgSO$_4$. Solvents were removed by distillation under a reduced pressure. The crude Under an Ar atmosphere, to a 1 L, three-neck flask, Compound K (10.00 g) was put and dissolved in dehydrated THF (200 ml), N,N,N',N'-tetramethylethylenediamine (TMEDA, 8.8 ml) was added thereto, and nBuLi (1.6 M in hexane, 36.7 ml) was added dropwise thereto at about −78° C. After stirring at about −78° C. for about 1 hour, a THF solution (60 ml) of Compound G (9.04 g) was added dropwise, followed by stirring for about 16 hours while gradually increasing the temperature to ambient temperature. Water was added to the resultant product, and an organic layer was extracted with CH$_2$Cl$_2$, separated, and dried with MgSO$_4$. Solvents were removed by distillation under a reduced pressure. The crude product thus obtained was separated by silica gel column chromatography to obtain 8.15 g (yield 67%) of Intermediate L. The molecular weight of Intermediate L measured by FAB-MS was 413.

Under an Ar atmosphere, to a 500 ml, three-neck flask, Intermediate L (5.00 g) was put and dissolved in dehydrated THF (100 ml), and nBuLi (1.6 M in hexane, 15.1 ml) was added dropwise thereto at about −78° C. After stirring at about −78° C. for about 1 hour, a THF solution (100 ml) of Compound J (6.55 g) was added dropwise thereto, followed by stirring for about 16 hours while gradually increasing the temperature to ambient temperature. Water was added to the resultant product, and an organic layer was extracted with $CH_2Cl_2$, separated, and dried with $MgSO_4$. Solvents were removed by distillation under a reduced pressure. The crude product thus obtained was dissolved in toluene (70 ml), and pTsOH (11.5 g) was added thereto, followed by heating and stirring at about 80° C. for about 6 hours. After the reaction, a precipitate thus produced was obtained by filtering and separated by recrystallization to obtain 3.22 g (yield 35%) of Compound 50. The molecular weight of a target material measured by FAB-MS was 762. From the result, the target product was identified as Compound 50.

2. Manufacture and Evaluation of Organic Electroluminescence Device Including a Polycyclic Compound (Manufacture of Organic Electroluminescence Devices)

Organic electroluminescence devices including the polycyclic compounds in an emission layer were manufactured by a method described below. Organic electroluminescence devices of Examples 1 to 4 were manufactured using Compound 4, Compound 14, Compound 49, and Compound 50 as materials for an emission layer. Organic electroluminescence devices of Comparative Examples 1 to 4 were manufactured using Comparative Compound X-1, Comparative Compound X-2, Comparative Compound X-3, and Comparative Compound X-4 as materials for an emission layer. Compounds used in the emission layer in Examples 1 to 4 and Comparative Examples 1 to 4 are shown below.

TABLE 1

Example Compounds

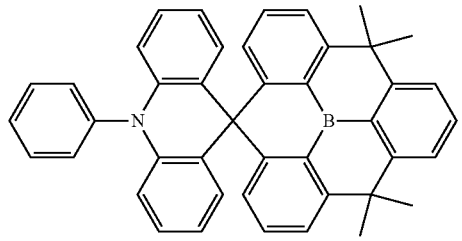

4

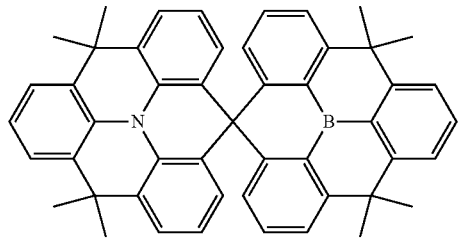

14

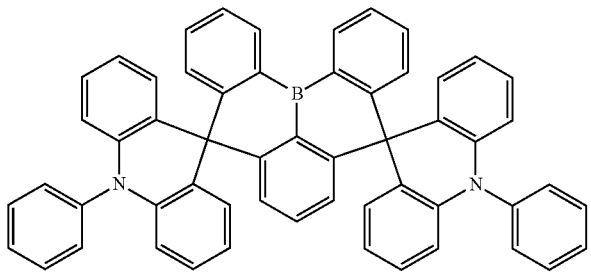

49

TABLE 1-continued
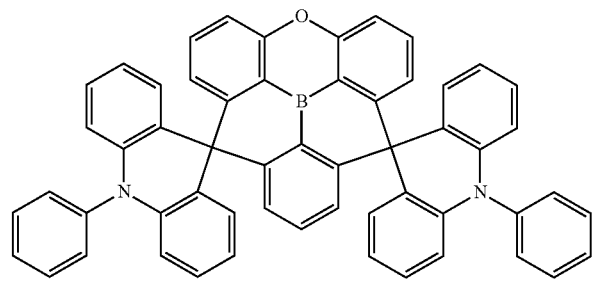
50
Comparative
Compounds
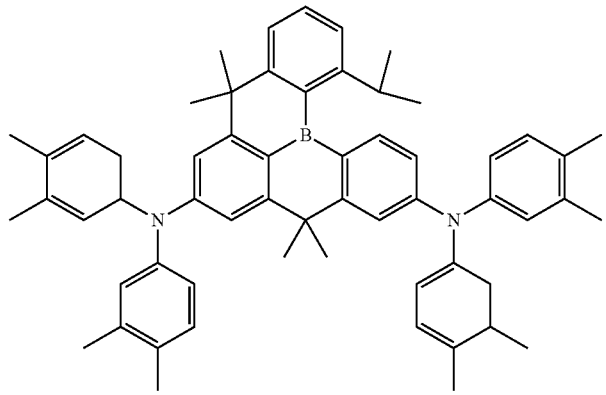
X-1
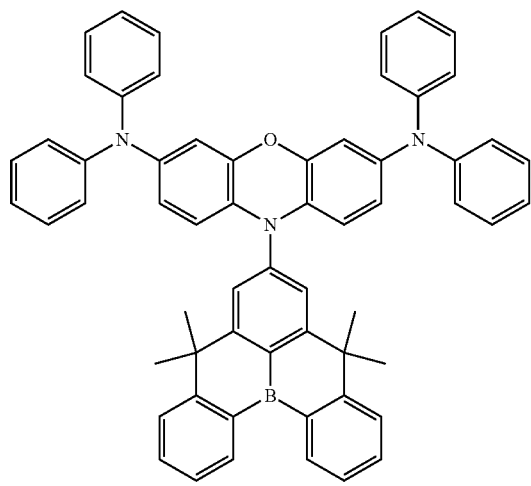
X-2
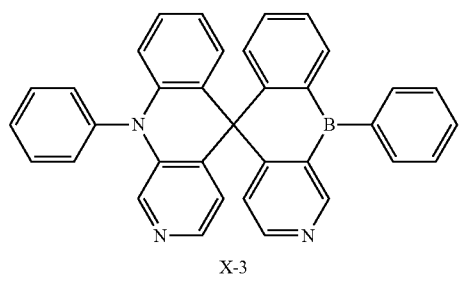
X-3

TABLE 1-continued

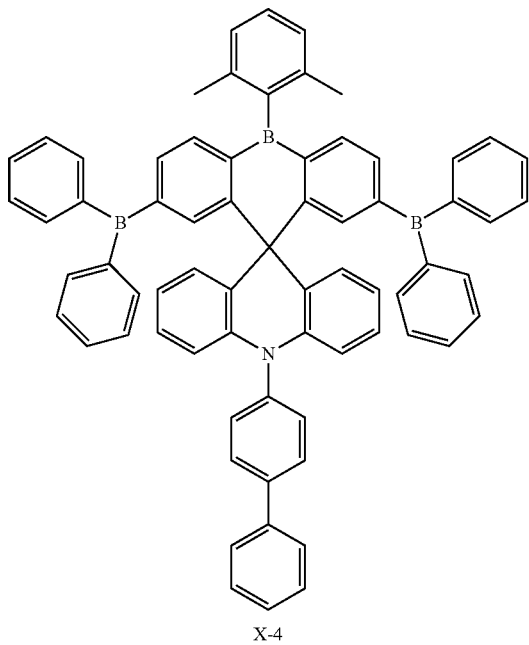

X-4

The organic electroluminescence devices of the Examples and the Comparative Examples were manufactured by a method described below.

On a glass substrate, ITO was patterned to a thickness of about 1,500 Å and washed with ultra-pure water, and a UV ozone treatment was conducted for about 10 minutes. Then, HAT-CN was deposited to a thickness of about 100 Å, α-NPD was deposited to a thickness of about 800 Å, and mCP was deposited to a thickness of about 50 Å to form a hole transport region.

Then, the compounds of Table 1, respectively, and DPEPO were co-deposited in a weight ratio of 18:82 to form an emission layer to a thickness of about 200 Å. Then, a layer with a thickness of about 100 Å was formed using DPEPO. In order to form the emission layer by the co-deposition, each of Compounds 4, 14, 49, and 50 was mixed with DPEPO and deposited in Examples 1 to 4, and each of Comparative Compounds X-1, X-2, X-3 and X-4 was mixed with DPEPO and deposited in Comparative Examples 1 to 4.

On the emission layer, a layer was formed using TPBi to a thickness of about 300 Å, and a layer was formed using LiF to a thickness of about 5 Å to form an electron transport region. Then, a second electrode was formed using aluminum (Al) to a thickness of about 1,000 Å.

In the examples, the hole transport region, the emission layer, the electron transport region and the second electrode were formed by using a vacuum deposition apparatus.

(Evaluation of Properties of Organic Electroluminescence Device)

In order to evaluate the properties of the organic electroluminescence devices of the Examples and the Comparative Examples, maximum emission wavelength (nm) and external quantum yield (%) were measured. The measurement was conducted using a luminous brightness measurement apparatus, C9920-11 of HAMAMATSU Photonics Co.

TABLE 2

| Division | Emission layer dopant | Maximum emission wavelength (nm) | External quantum yield (%) |
|---|---|---|---|
| Example 1 | Compound 4 | 465 | 15 |
| Example 2 | Compound 14 | 468 | 16 |
| Example 3 | Compound 49 | 470 | 15 |
| Example 4 | Compound 50 | 460 | 13 |
| Comparative Example 1 | Comparative Compound X-1 | 480 | 8 |
| Comparative Example 2 | Comparative Compound X-2 | 488 | 7 |
| Comparative Example 3 | Comparative Compound X-3 | 495 | 5 |
| Comparative Example 4 | Comparative Compound X-4 | 482 | 5 |

Referring to Table 2, it may be seen that the organic electroluminescence devices of Examples 1 to 4, which used the compounds represented by Formula 1 as a dopant material, showed higher external quantum efficiency when compared with Comparative Examples 1 to 4. In addition, it may be seen that the organic electroluminescence devices of Examples 1 to 4, compounds represented by Formula 1 as a dopant material, showed deep blue emission with an emission wavelength of about 470 nm or less, when compared with Comparative Examples 1 to 4.

Referring to the results of Table 2, the Example compounds show high emission efficiency in deep blue emission region, and may be used as materials for thermally activated delayed fluorescence with high efficiency.

The organic electroluminescence device of Examples 1-4 included the compound represented by Formula 1 in an emission layer, and achieved deep blue emission which has short wavelength, and high emission efficiency at the same time.

When compared with the Examples, in Comparative Compounds X-1 and X-2, an electron donor and an electron acceptor did not form a Spiro bond, and the electron donor and the electron acceptor did not have an orthogonal shape.

Accordingly, the organic electroluminescence devices of Comparative Examples 1 and 2 showed relatively lower external quantum efficiency when compared with the Examples.

In Comparative Compound X-3 used in Comparative Example 3, an electron donor and an electron acceptor formed a spiro bond, but the organic electroluminescence device of Comparative Example 3 showed lower external quantum efficiency when compared with the Examples. In Comparative Compound X-3, the electron donor and the electron acceptor formed a condensed ring with an azine ring, and molecular stability was degraded, the charge balance of an emission layer was decreased, and the external quantum efficiency of an organic electroluminescence device was low.

In addition, in Comparative Compound X-4 used in Comparative Example 4, an electron donor and an electron acceptor formed a Spiro bond, but the organic electroluminescence device of Comparative Example 4 showed lower external quantum efficiency when compared with the Examples. In Comparative Compound X-4, a boryl group was included in a molecule, and molecular stability was degraded, the charge balance of an emission layer was decreased, and the external quantum efficiency of an organic electroluminescence device was low.

By way of summation and review, in the application of an organic electroluminescence device to a display device, the driving voltage may be decreased, and the light-emitting efficiency and the life of the organic electroluminescence device may be increased. Developments on materials for an organic electroluminescence device stably attaining the above properties may be considered.

For example, in order to provide an organic electroluminescence device with high efficiency, techniques on phosphorescence emission which uses energy in a triplet state or delayed fluorescence emission which uses the generating phenomenon of singlet excitons by the collision of triplet excitons (triplet-triplet annihilation, TTA) may be considered. A material for thermally activated delayed fluorescence (TADF) using delayed fluorescence phenomenon may also be considered.

The organic electroluminescence device according to an embodiment may attain high efficiency and long life.

The compound according to an embodiment may help improve the life and efficiency of an organic electroluminescence device.

One or more embodiments may provide an organic electroluminescence device having long lifespan and high efficiency.

One or more embodiments may provide an organic electroluminescence device including a material for emitting thermally activated delayed fluorescence, and a compound used as a material for emitting thermally activated delayed fluorescence.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescence device, comprising:

a first electrode;

a hole transport region on the first electrode;

an emission layer on the hole transport region;

an electron transport region on the emission layer; and a second electrode on the electron transport region, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and oxides thereof, and wherein the emission layer includes a polycyclic compound represented by any one among the following Formulae 1, 1-1, 3-1, 3-2, 4, or 5:

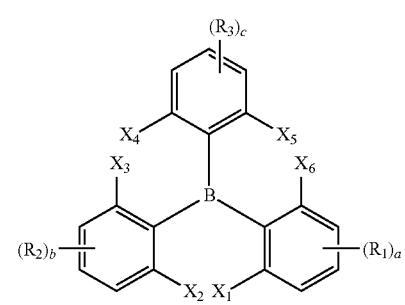

[Formula 1]

wherein, in Formula 1, $R_1$ to $R_3$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms ring, or a substituted or unsubstituted heteroaryl group having 2 to 30 ring carbon atoms, a to c are each independently an integer of 0 to 3, and $X_3$ to $X_6$ are each independently a hydrogen atom, a deuterium atom, a halogen atom, a cyano group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $X_3$ to $X_6$ being separate or combined with an adjacent group to form a ring, and $X_1$ and $X_2$ combine to form a group represented by the following Formulae 2-1 or 2-2:

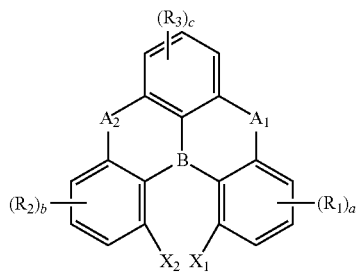

[Formula 1-1]

wherein, in Formula 1-1, $A_1$ and $A_2$ are each independently a direct linkage, S, $SiR_{12}R_{13}$, or $CR_{14}R_{15}$, $R_{12}$ to $R_{15}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and $X_1$ and $X_2$ combine to form a group represented by the following Formula 2-2, $R_1$ to $R_3$, and a to c are defined the same as those of Formula 1:

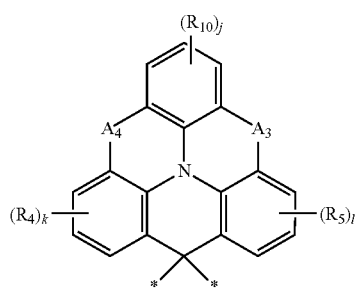

[Formula 2-1]

wherein, in Formula 2-1, $R_4$, $R_5$, and $R_{10}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, j, k, and l are each independently an integer of 0 to 3, $A_3$ and $A_4$ are each independently a direct linkage, $NR_{17}$, O, S, $SiR_{18}R_{19}$, or $CR_{20}R_{21}$, $R_{17}$ to $R_{21}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_{17}$ to $R_{21}$ being separate or combined with an adjacent group to form a ring, and

* represents a binding site to Formula 1,

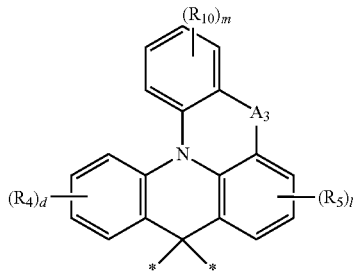

[Formula 2-2]

wherein, in Formula 2-2, $A_3$ is $NR_{17}$, S, $SiR_{18}R_{19}$, or $CR_{20}R_{21}$, $R_4$, $R_5$ and $R_{10}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_4$ and $R_{10}$ being separate or combined with an adjacent group to form a ring, l is an integer of 0 to 3, d and m are each independently an integer of 0 to 4, $R_{17}$ to $R_{21}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_{17}$ to $R_{21}$ being separate or combined with an adjacent group to form a ring, when $Ar_3$ is $CR_{20}R_{21}$, $R_{20}$ and $R_{21}$ are combined with each other to form a ring, and

* represents a binding site to Formula 1 or Formula 1-1,

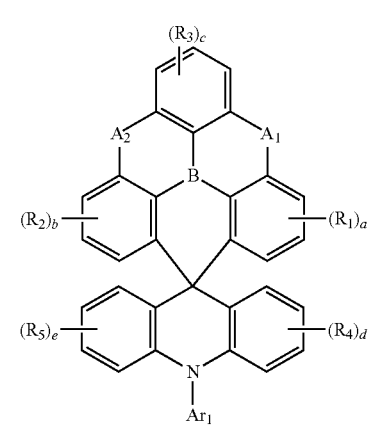

[Formula 3-1]

wherein, in Formulae 3-1, $R_1$ to $R_3$ are defined the same as those of Formula 1, $R_4$ and $R_5$ are defined the same as those of Formula 2-1, a to c are defined the same as those of Formula 1, d and e are each independently an integer of 0 to 4, $Ar_1$ is a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and $A_1$ and $A_2$ are each independently S or $SiR_{12}R_{13}$,

[Formula 3-2]

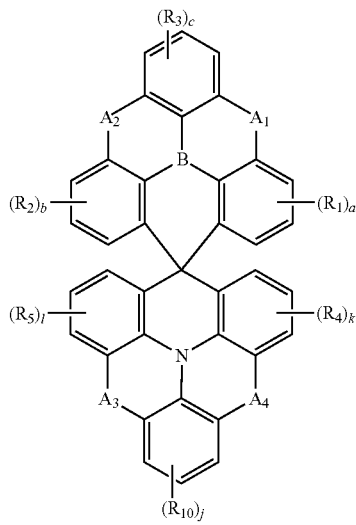

wherein, in Formula 3-2, $R_1$ to $R_3$ are defined the same as those of Formula 1, $R_4$, $R_5$, and $R_{10}$ are defined the same as those of Formula 2-1, a to c are defined the same as those of Formula 1, j, k, and l are defined the same as those of Formula 2-1, $A_1$ to $A_4$ are each independently a direct linkage, $NR_{23}$, O, S, $SiR_{24}R_{25}$, Or $CR_{26}R_{27}$, and $R_{23}$ to $R_{27}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_{23}$ to $R_{27}$ being separate or combined with an adjacent group to form a ring,

[Formula 4]

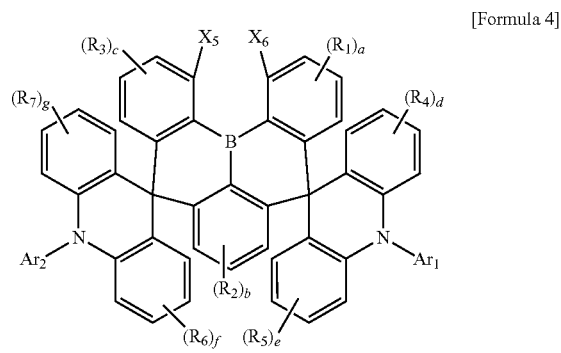

wherein, in Formula 4, $R_6$ and $R_7$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_6$ and $R_7$ being separate or combined with an adjacent group to form a ring, f and g are each independently an integer of 0 to 4, $Ar_2$ is a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and $X_5$, $X_6$, $R_1$ to $R_5$, $Ar_1$, and a to e are defined the same as those of Formula 1, Formula 2-1, and Formula 3-1, and

[Formula 5]

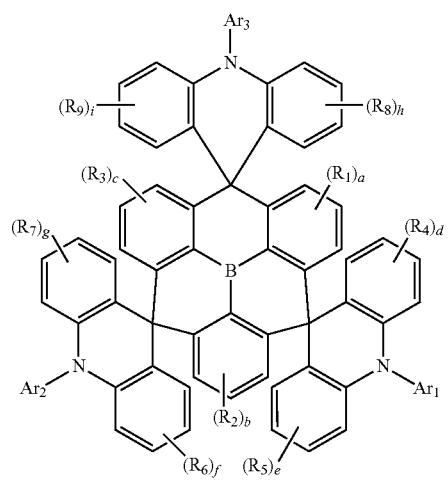

wherein, in Formula 5, $R_6$ to $R_9$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_6$ to $R_9$ being separate or combined with an adjacent group to form a ring, f to i are each independently an integer of 0 to 4, $Ar_2$ and $Ar_3$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and $R_1$ to $R_5$, $Ar_1$, and a to e are defined the same as those of Formula 1, Formula 2-1, and Formula 3-1.

2. The organic electroluminescence device as claimed in claim 1, wherein the emission layer emits delayed fluorescence.

3. The organic electroluminescence device as claimed in claim 1, wherein:
the emission layer is a delayed fluorescence emission layer including a host and a dopant, and
the dopant includes the compound represented by Formula 1.

4. The organic electroluminescence device as claimed in claim 1, wherein the emission layer is a thermally activated delayed fluorescence emission layer that emits blue light.

5. The organic electroluminescence device as claimed in claim 1, wherein the compound represented by Formula 4 is represented by the following Formula 4-1:

[Formula 4-1]

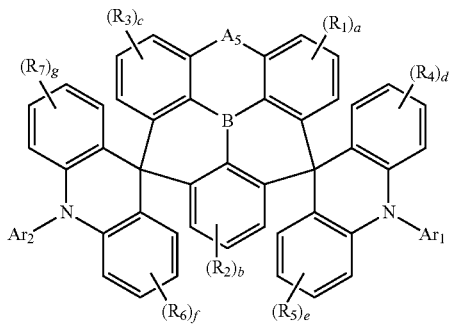

wherein, in Formula 4-1, $A_5$ is a direct linkage, $NR_{29}$, O, S, $SiR_{30}R_{31}$, or $CR_{32}R_{33}$, $R_{29}$ to $R_{33}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_{29}$ to $R_{33}$ being separate or combined with an adjacent group to form a ring, and $R_1$ to $R_7$, $Ar_1$, $Ar_2$, and a to g are defined the same as those of Formula 4.

6. The organic electroluminescence device as claimed in claim 1, wherein $Ar_1$ in Formulae 3-1, 4, and 5 is a group represented by one of $Ar_1$-1 to $Ar_1$-3:

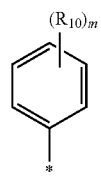 $Ar_1$-1

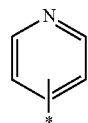 $Ar_1$-2

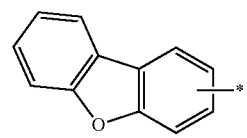 $Ar_1$-3 wherein, in $Ar_1$-1, $R_{10}$ is a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, m is an integer of 0 to 4, and

* represents a binding site.

7. The organic electroluminescence device as claimed in claim 1, wherein the polycyclic compound represented by Formulae 1, 1-1, 3-1, 3-2, 4, or 5 is a compound of the following Compound Group 1:

[Compound Group 1]

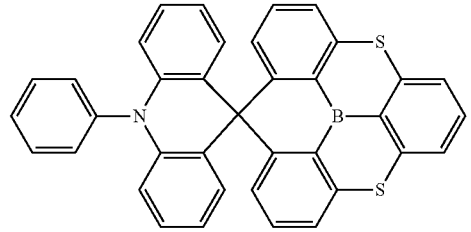

3

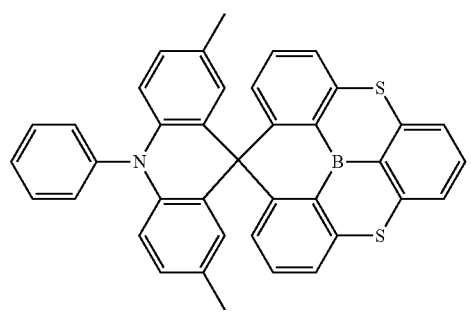

8

11
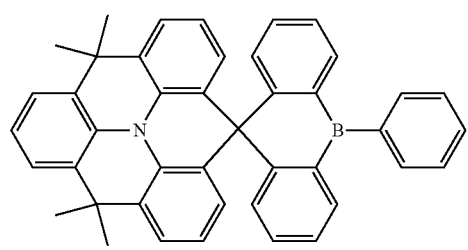
13
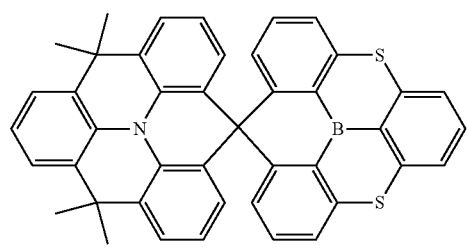
14
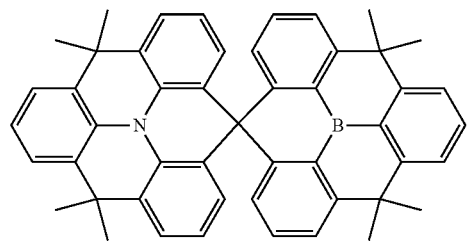
15
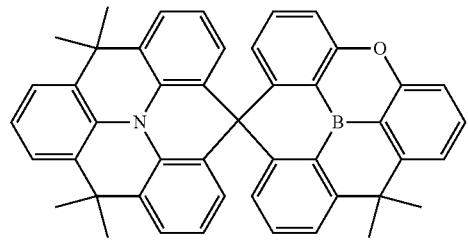
26
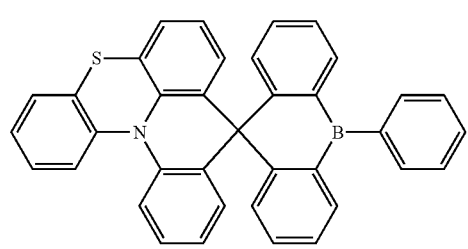
29
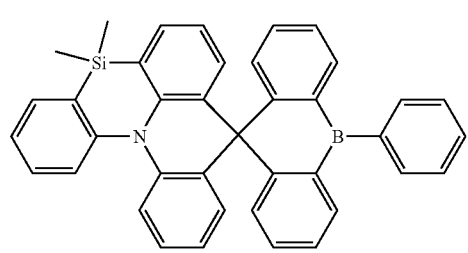
30
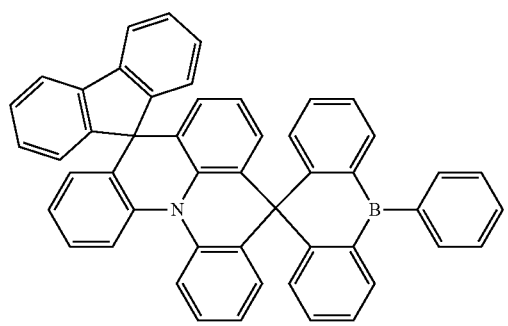
31
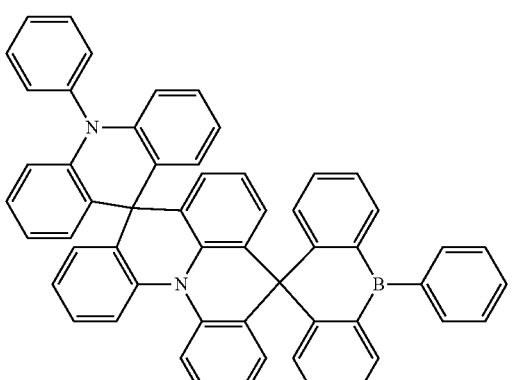
32
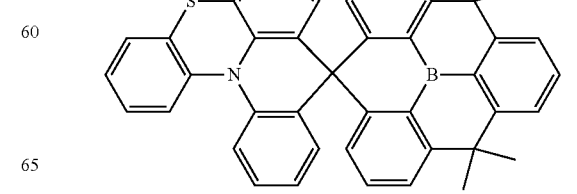
33
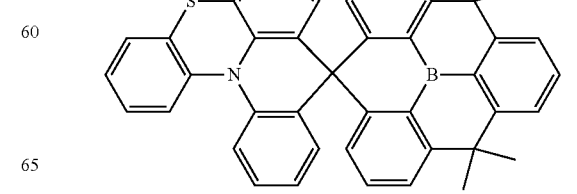
35

38
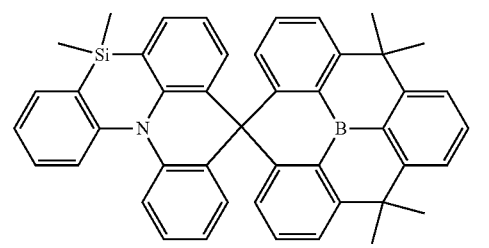
39
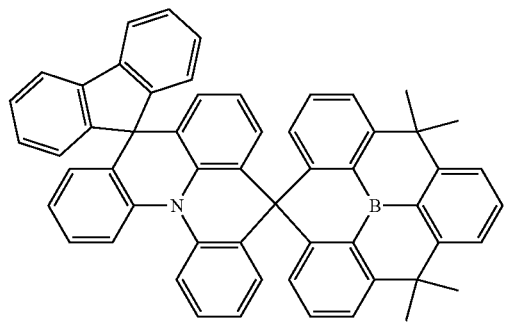
40
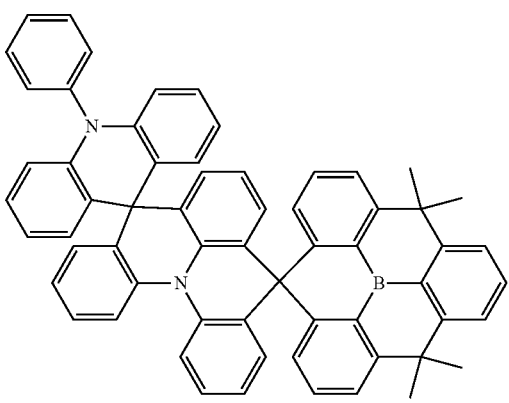
41
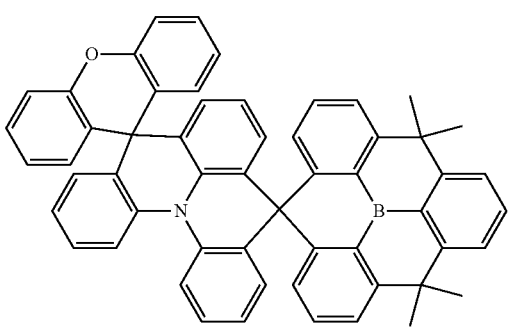
42
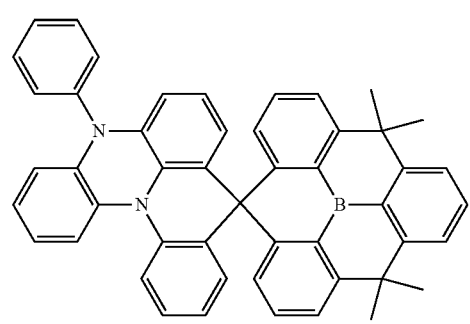
46
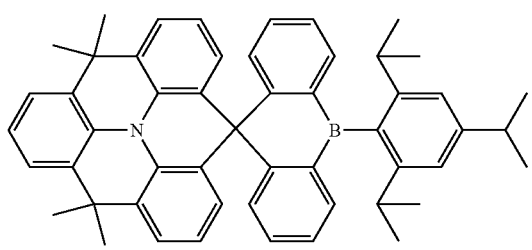
47
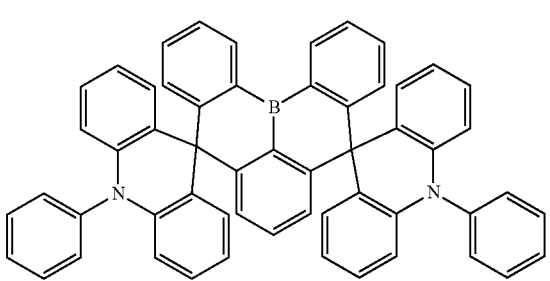
48
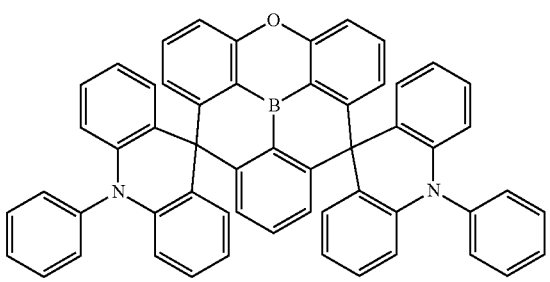
49
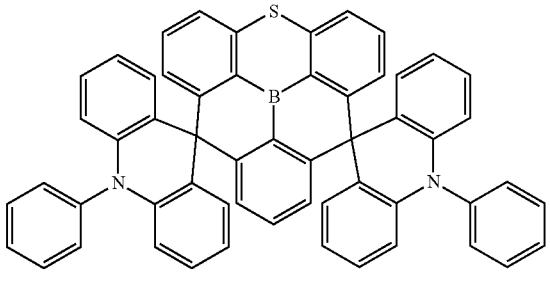
50
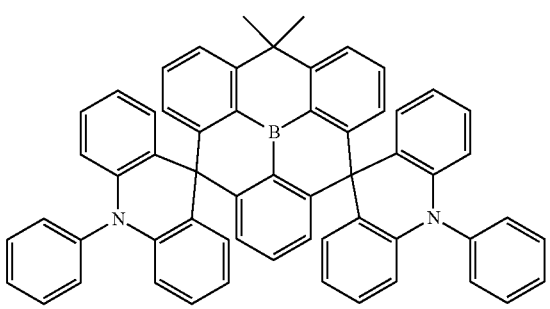

51
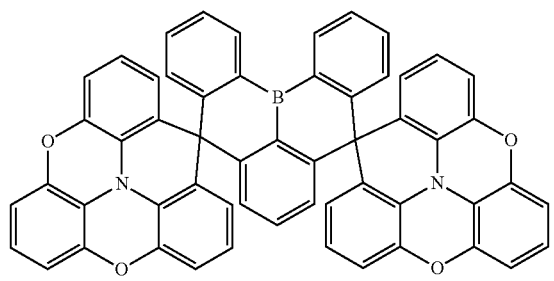
52
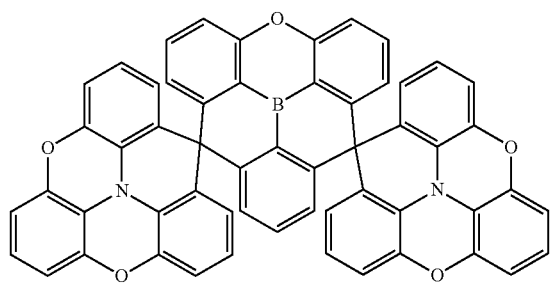
53
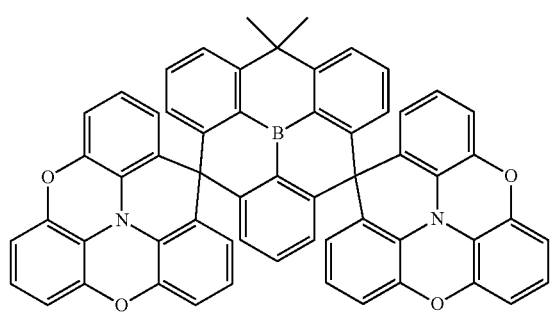
54
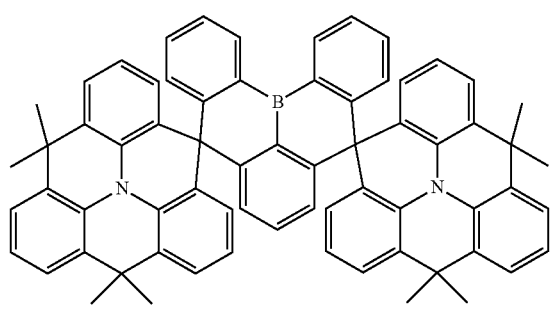
56
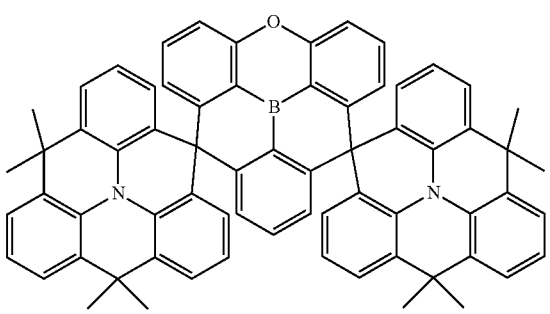
57
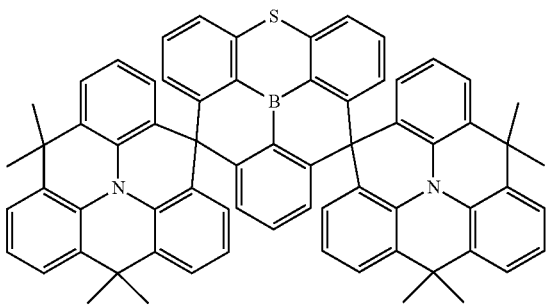
58
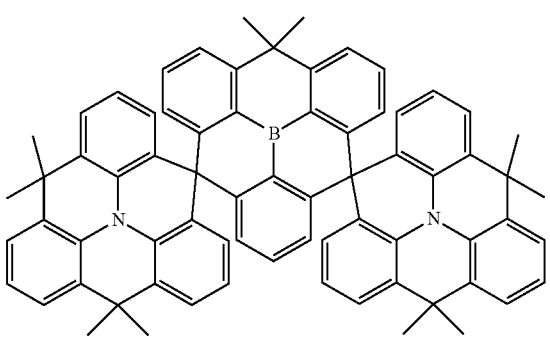
59
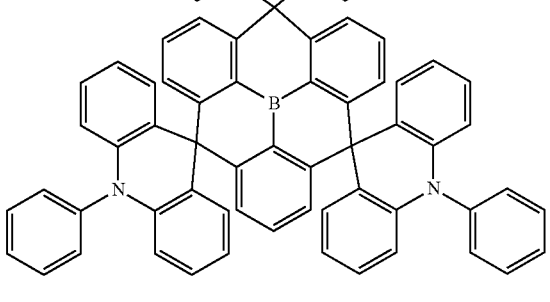

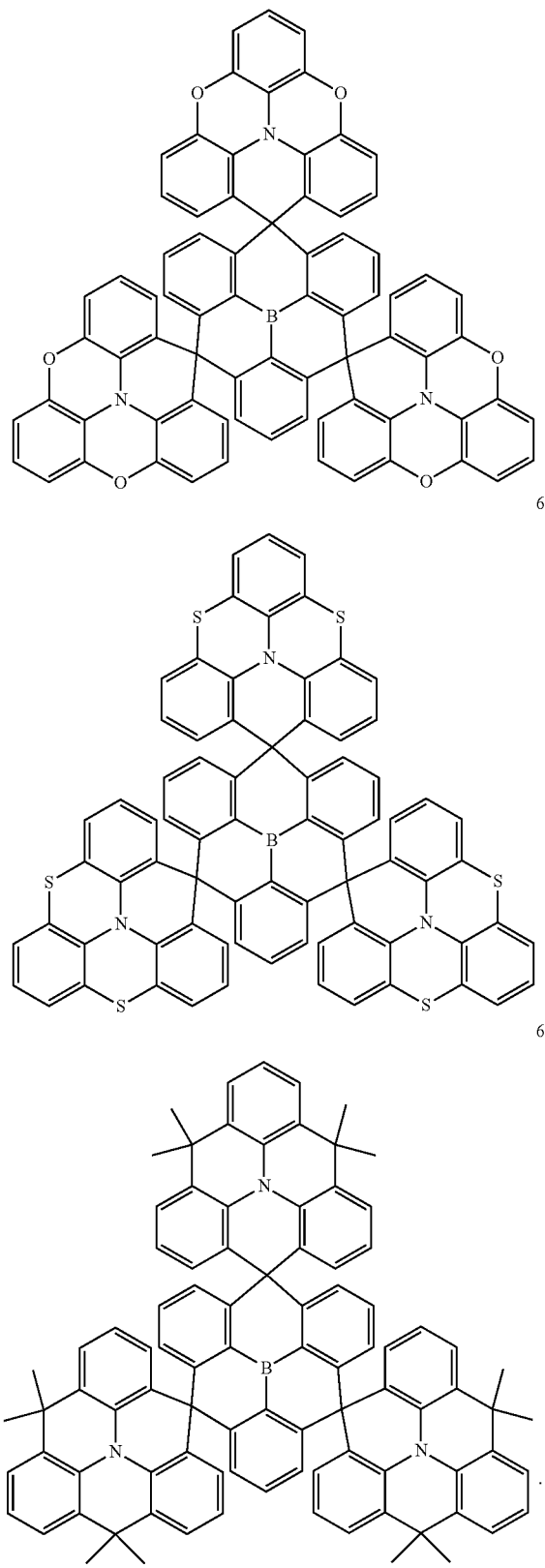

8. A polycyclic compound represented by the following Formulae 1, 1-1, 3-1, 3-2, 4, or 5:

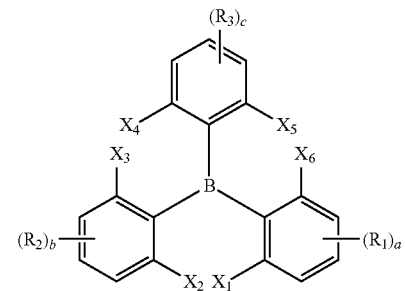

[Formula 1]

wherein, in Formula 1,
R$_1$ to R$_3$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms ring, or a substituted or unsubstituted heteroaryl group having 2 to 30 ring carbon atoms,
a to c are each independently an integer of 0 to 3, and
X$_3$ to X$_6$ are each independently a hydrogen atom, a deuterium atom, a halogen atom, a cyano group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, X$_3$ to X$_6$ being separate or combined with an adjacent group to form a ring, and X$_1$ and X$_2$ combine to form a group represented by the following Formulae 2-1 or 2-2:

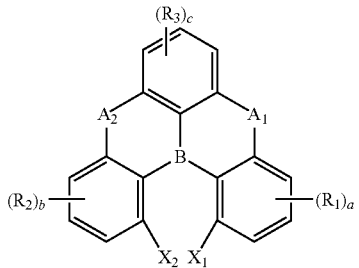

[Formula 1-1]

wherein, in Formulae 1-1,
A$_1$ and A$_2$ are each independently a direct linkage, S, SiR$_{12}$R$_{13}$, or CR$_{14}$R$_{15}$,
R$_{11}$ to R$_{15}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and
X$_1$ and X$_2$ combine to form a group represented by the following Formula 2-2,
R$_1$ to R$_3$, and a to c are defined the same as those of Formula 1:

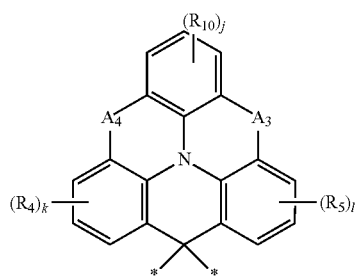

[Formula 2-1]

wherein, in Formula 2-1, $R_4$, $R_5$, and $R_{10}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, j, k, and l are each independently an integer of 0 to 3, $A_3$ and $A_4$ are each independently a direct linkage, $NR_{17}$, O, S, $SiR_{18}R_{19}$, or $CR_{20}R_{21}$, $R_{17}$ to $R_{21}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_{17}$ to $R_{21}$ being separate or combined with an adjacent group to form a ring, and

* represents a binding site to Formula 1,

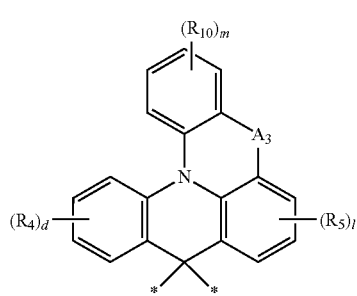

[Formula 2-2]

wherein, in Formula 2-2, $A_3$ is $NR_{17}$, S, $SiR_{18}R_{19}$, or $CR_{20}R_{21}$, $R_4$, $R_5$ and $R_{10}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_4$ and $R_{10}$ being separate or combined with an adjacent group to form a ring, l is an integer of 0 to 3, d an m are each independently an integer of 0 to 4, $R_{17}$ to $R_{21}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_{17}$ to $R_{21}$ being separate or combined with an adjacent group to form a ring, when $Ar_3$ is $CR_{20}R_{21}$, $R_{20}$ and $R_{21}$ are combined with each other to form a ring, and

* represents a binding site to Formula 1 or Formula 1-1,

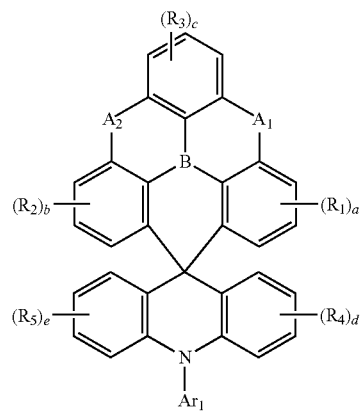

[Formula 3-1]

$R_1$ to $R_3$ are defined the same as those of Formula 1, $R_4$ and $R_5$ are defined the same as those of Formula 2-1, a to c are defined the same as those of Formula 1, d and e are each independently an integer of 0 to 4, $Ar_1$ is a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and $A_1$ and $A_2$ are each independently S or $SiR_{12}R_{13}$,

[Formula 3-2]

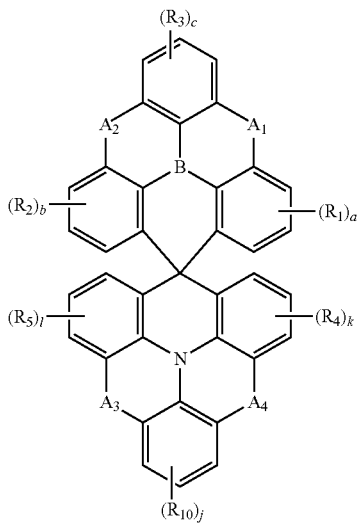

wherein, in Formula 3-2,
$R_1$ to $R_3$ are defined the same as those of Formula 1,
$R_4$, $R_5$, and $R_{10}$ are defined the same as those of Formula 2-1,
a to c are defined the same as those of Formula 1,
j, k, and l are defined the same as those of Formula 2-1,
$A_1$ to $A_4$ are each independently a direct linkage, $NR_{23}$, O, S, $SiR_{24}R_{25}$, Or $CR_{26}R_{27}$, and
$R_{23}$ to $R_{27}$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_{23}$ to $R_{27}$ being separate or combined with an adjacent group to form a ring,

[Formula 4]

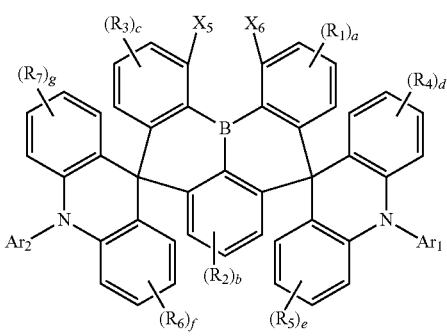

wherein, in Formula 4,
$R_6$ and $R_7$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_6$ and $R_7$ being separate or combined with an adjacent group to form a ring, f and g are each independently an integer of 0 to 4,
$Ar_2$ is a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and
$X_5$, $X_6$, $R_1$ to $R_5$, $Ar_1$, and a to e are defined the same as those of Formula 1 and Formula 2-1, and Formula 3-1, and

[Formula 5]

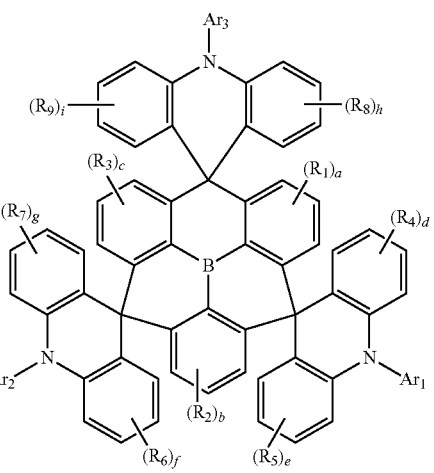

wherein, in Formula 5,
$R_6$ to $R_9$ are each independently a hydrogen atom, a deuterium atom, a halogen atom, a cyano group, a substituted or unsubstituted amine group, a hydroxyl group, a substituted or unsubstituted thiol group, a substituted or unsubstituted silyl group, a substituted or unsubstituted alkyl group having 1 to 20 carbon atoms, a substituted or unsubstituted aryl group having 6 to 30 ring carbon atoms, a substituted or unsubstituted heteroaryl group having 2 to 30 ring carbon atoms, $R_6$ to $R_9$ being separate or combined with an adjacent group to form a ring, f to i are each independently an integer of 0 to 4,
$Ar_2$ and $Ar_3$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, and
$R_1$ to $R_5$, $Ar_1$, and a to e are defined the same as those of Formula 1, Formula 2-1, and Formula 3-1.

9. The polycyclic compound as claimed in claim 8, wherein the polycyclic compound represented by Formulae 1, 1-1, 3-1, 3-2, 4, or 5 is a compound of the following Compound Group 1:

[Compound Group 1]
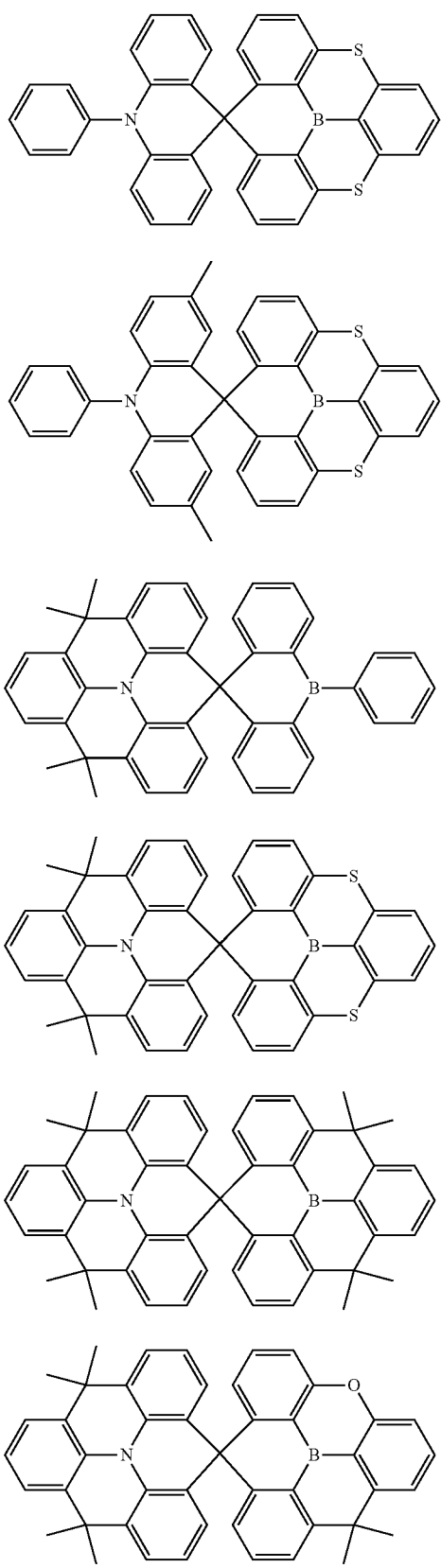
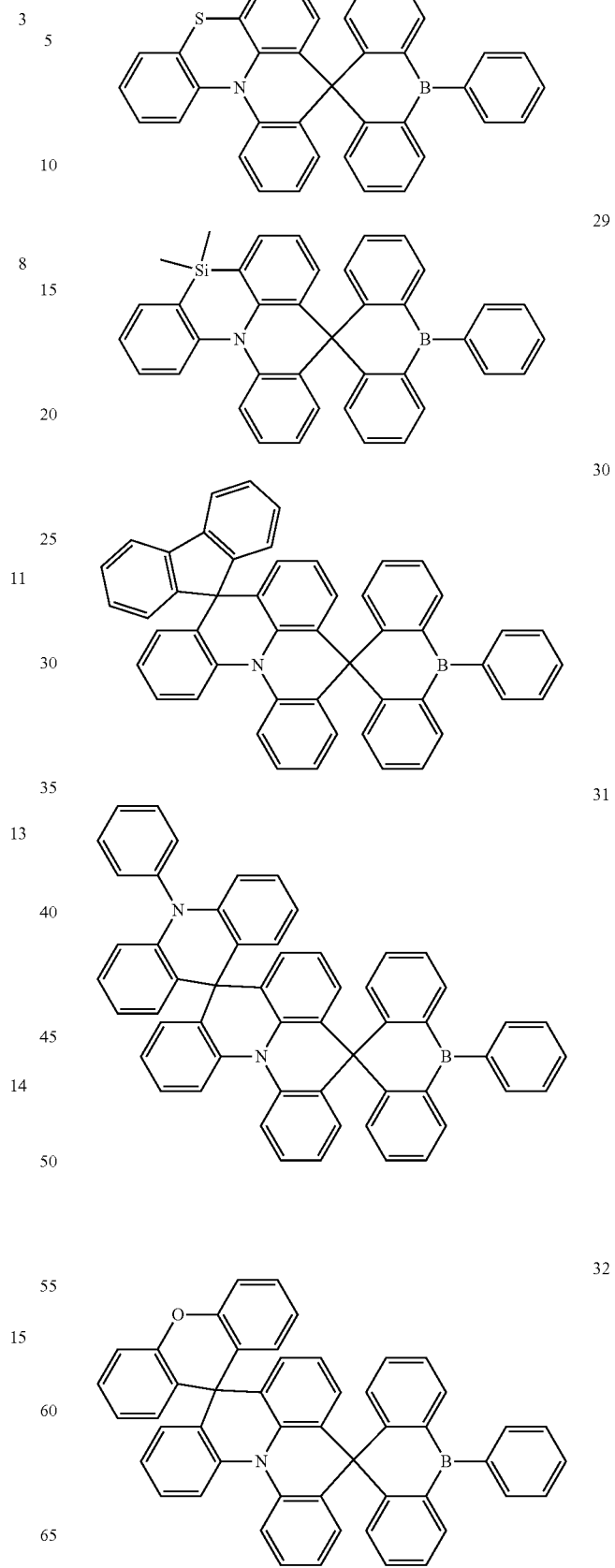

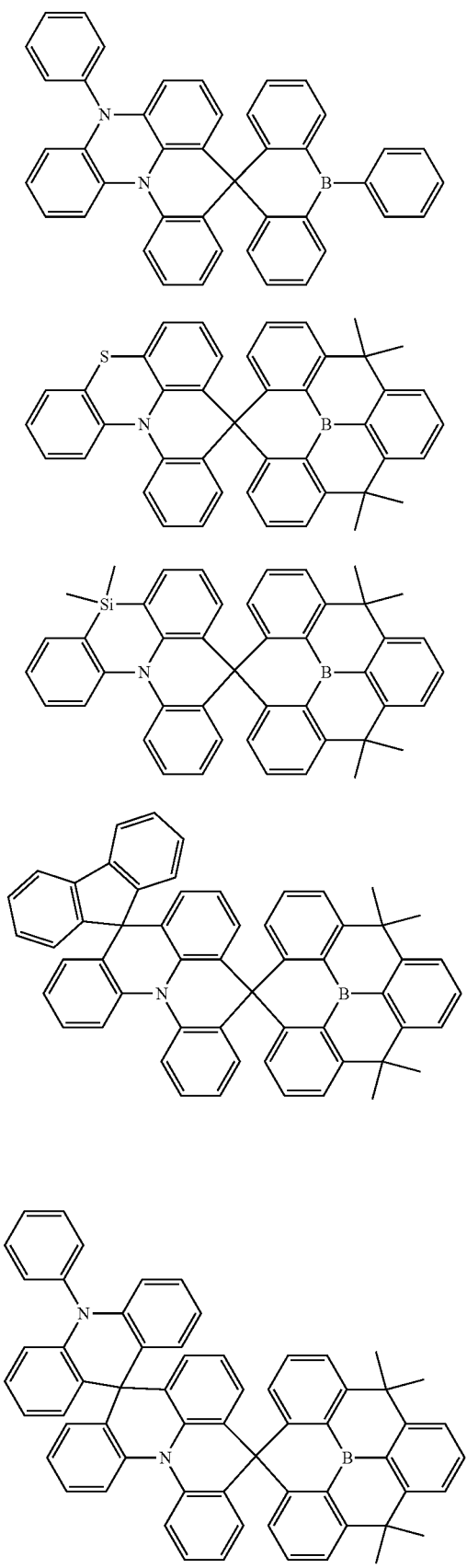
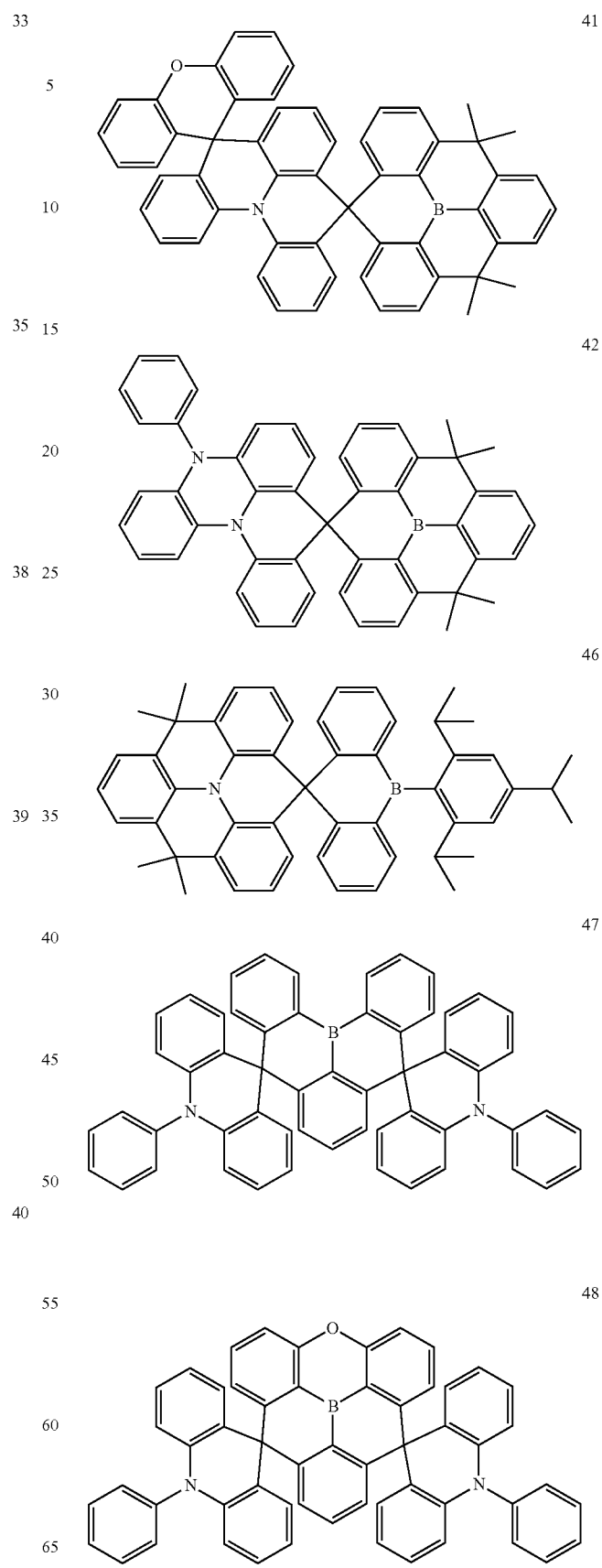

49
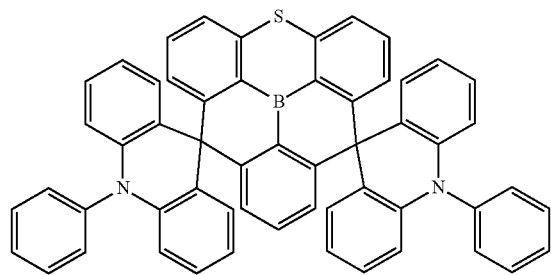
50
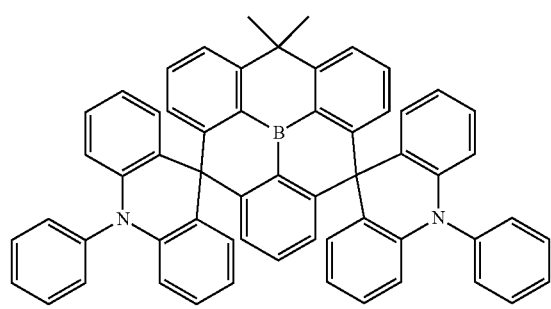
51
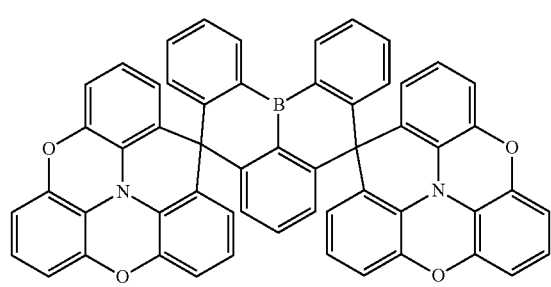
52
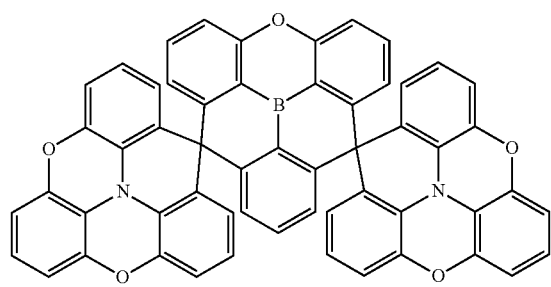
53
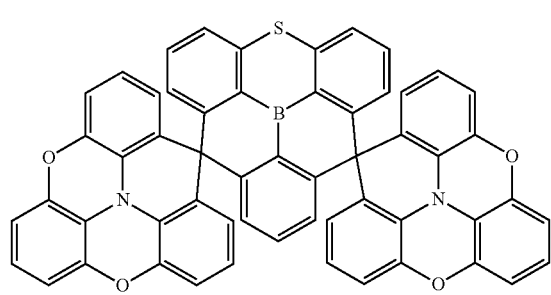
54
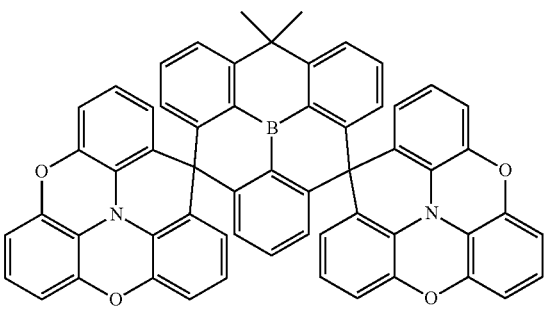
55
56
57
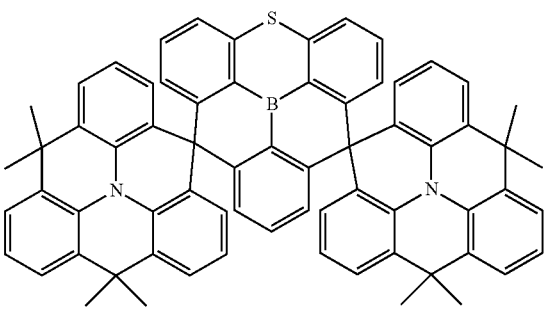

58
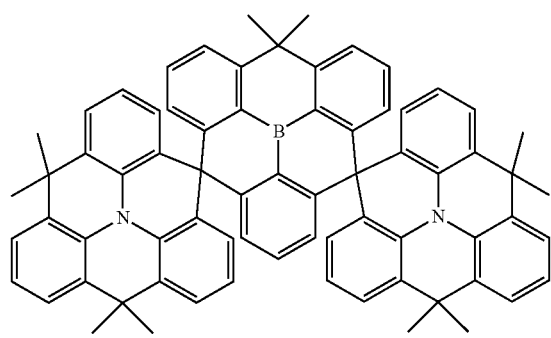
59
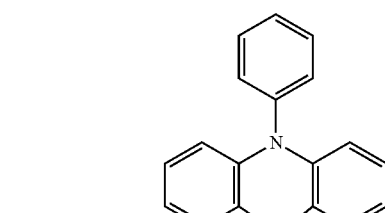
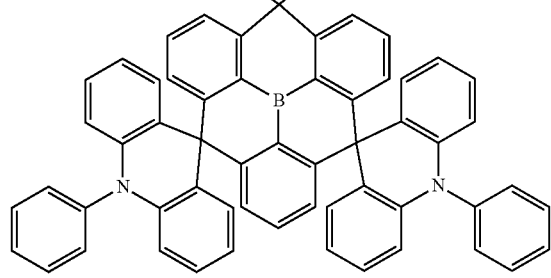
60
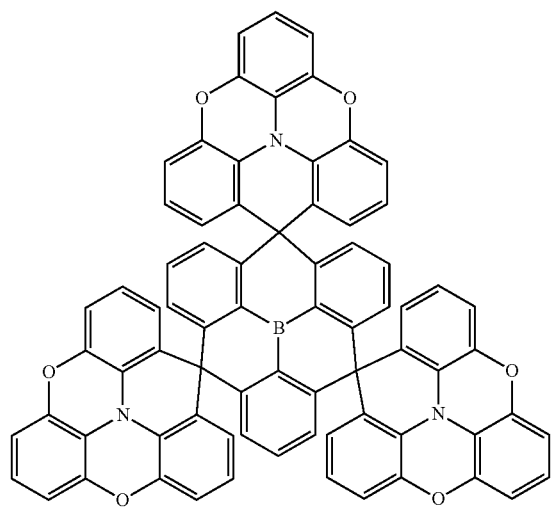
61
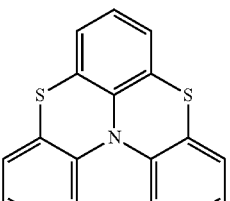
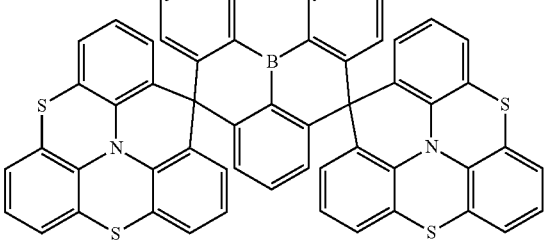
62
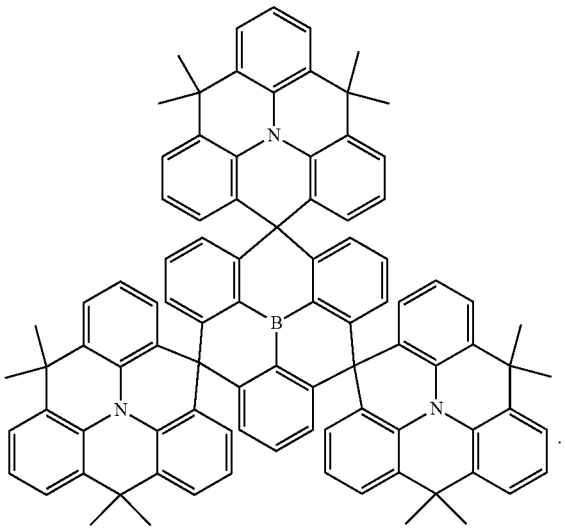
* * * * *